United States Patent
Arai et al.

(10) Patent No.: US 11,031,054 B1
(45) Date of Patent: Jun. 8, 2021

(54) APPARATUSES AND METHODS FOR PRE-EMPHASIS CONTROL

(71) Applicant: MICRON TECHNOLOGY, INC., Boise, ID (US)

(72) Inventors: Tetsuya Arai, Sagamihara (JP); Junki Taniguchi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/749,811

(22) Filed: Jan. 22, 2020

(51) Int. Cl.
G11C 7/00 (2006.01)
G11C 7/12 (2006.01)
G11C 11/4074 (2006.01)
G11C 7/10 (2006.01)
G11C 7/22 (2006.01)

(52) U.S. Cl.
CPC ............ G11C 7/12 (2013.01); G11C 7/1051 (2013.01); G11C 7/22 (2013.01); G11C 11/4074 (2013.01)

(58) Field of Classification Search
CPC .......... G11C 7/12; G11C 7/22; G11C 7/1051; G11C 11/4074
See application file for complete search history.

(56) References Cited

U.S. PATENT DOCUMENTS

| | | | |
|---|---|---|---|
| 2007/0075745 A1* | 4/2007 | Song | H04L 25/0286 326/83 |
| 2013/0033290 A1* | 2/2013 | King | H04L 25/0276 327/108 |
| 2013/0147532 A1* | 6/2013 | Song | H03K 19/018585 327/170 |

* cited by examiner

*Primary Examiner* — Uyen Smet
(74) *Attorney, Agent, or Firm* — Dorsey & Whitney LLP

(57) ABSTRACT

Apparatuses and methods for pre-emphasis control are described. An example apparatus includes a pull-up circuit and a pull-down circuit. The pull-up circuit is configured to receive a pull-up data activation signal and drive a data terminal to a pull-up voltage responsive to an active pull-up data activation signal. The pull-down circuit is configured to receive a pull-down activation signal and drive a data terminal to a pull-down voltage responsive to an active pull-down data activation signal. The example apparatus further includes a pull-up pre-emphasis circuit that includes a pre-emphasis timing control circuit configured to provide a timing control signal, and further includes a pull-up logic circuit. A pull-up pre-emphasis control signal based on pull-up data activation signal is provided to control providing pull-up pre-emphasis for greater than one unit interval of data when the pull-up data activation signal remains active for greater than one unit interval.

18 Claims, 19 Drawing Sheets

APPARATUSES AND METHODS FOR PRE-EMPHASIS CONTROL

BACKGROUND

Digital systems, such as memory devices, continue to operate at higher and higher speeds. Various signal lines that carry digital signals may exhibit low-pass filter (LPF) characteristics, either due to increasing channel loss with frequency, or through capacitive filtering. Thus, the maximum data rate supported by a channel becomes limited.

To compensate for LPF effects of a channel, various equalization techniques have been used. Typically, an equalizer circuit with a high pass frequency response may be provided. When a low pass channel is matched with a high pass equalizer, the overall frequency response may be flattened. One conventional approach to equalization includes modification of the shape of a transmitted signal such that the capacitance of the signal line causes the transmitted signal to be received with a desired shape, for example, by pre-emphasis. Pre-emphasis refers to increasing the amplitude of a digital signal by providing, at every bit transition, an overshoot that becomes filtered by the capacitive effects of the signal line.

The timing of applying pre-emphasis should be accurately controlled to pre-emphasize a digital signal successfully. Where the pre-emphasis is applied early, or late, or for an insufficient duration of time, the digital signal may be distorted unpredictably and/or the pre-emphasis is ineffective. Therefore, it would be desirable to have apparatuses and methods to control the timing of applying pre-emphasis to digital signals.

DETAILED DESCRIPTION

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
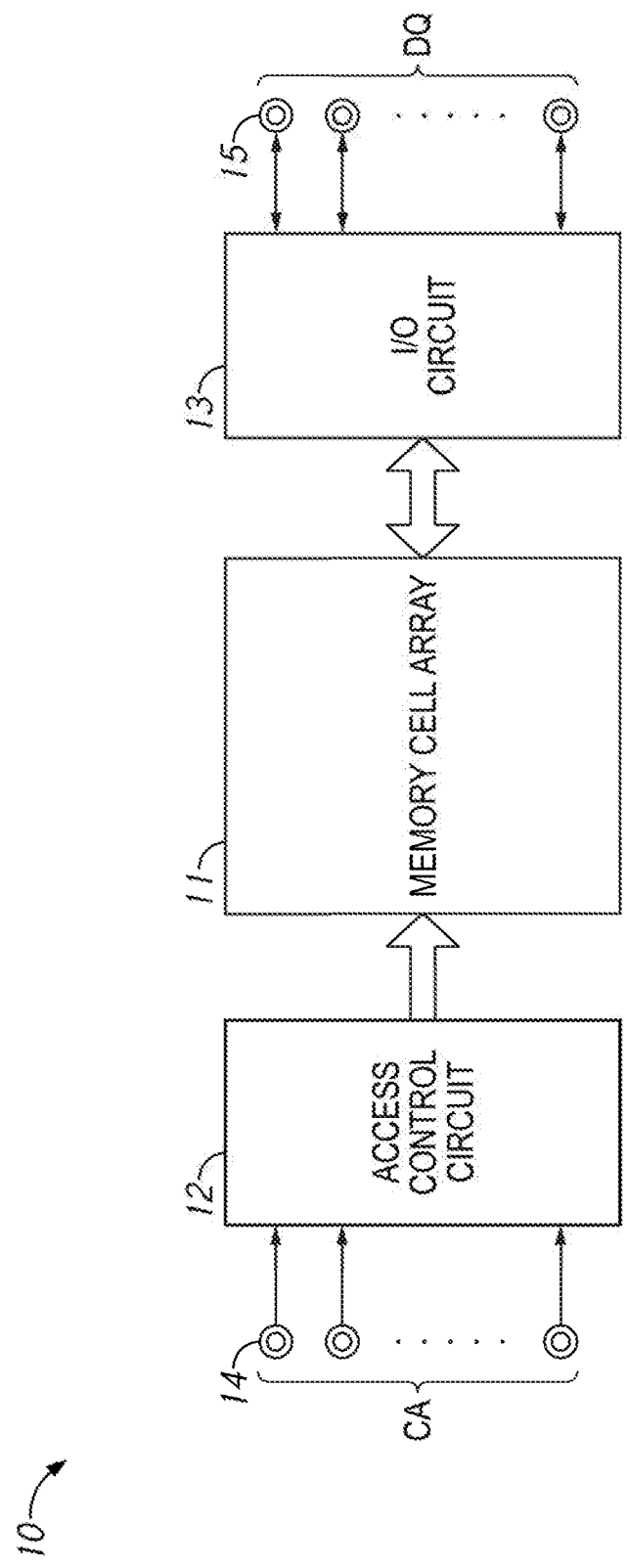
FIG. 1 is a block diagram showing a configuration of a semiconductor device according to an embodiment of the disclosure.

A semiconductor device 10 shown in FIG. 1 is an LPDDR5 (Low-Power Double Data Rate 5) DRAM, for example, and has a memory cell array 11, an access control circuit 12 that provides access to the memory cell array 11, and an I/O circuit 13 that inputs data to and outputs data from the memory cell array 11. The access control circuit 12 provides access to the memory cell array 11 based on a command address signal CA input from an external controller via a command address terminal 14. In a read operation, data DQ read out from the memory cell array 11 is output to a data terminals 15 via the I/O circuit 13. In a write operation, data DQ input to the data terminals IS from the external controller is provided to the memory cell array 11 via the I/O circuit 13.

Figure 2:
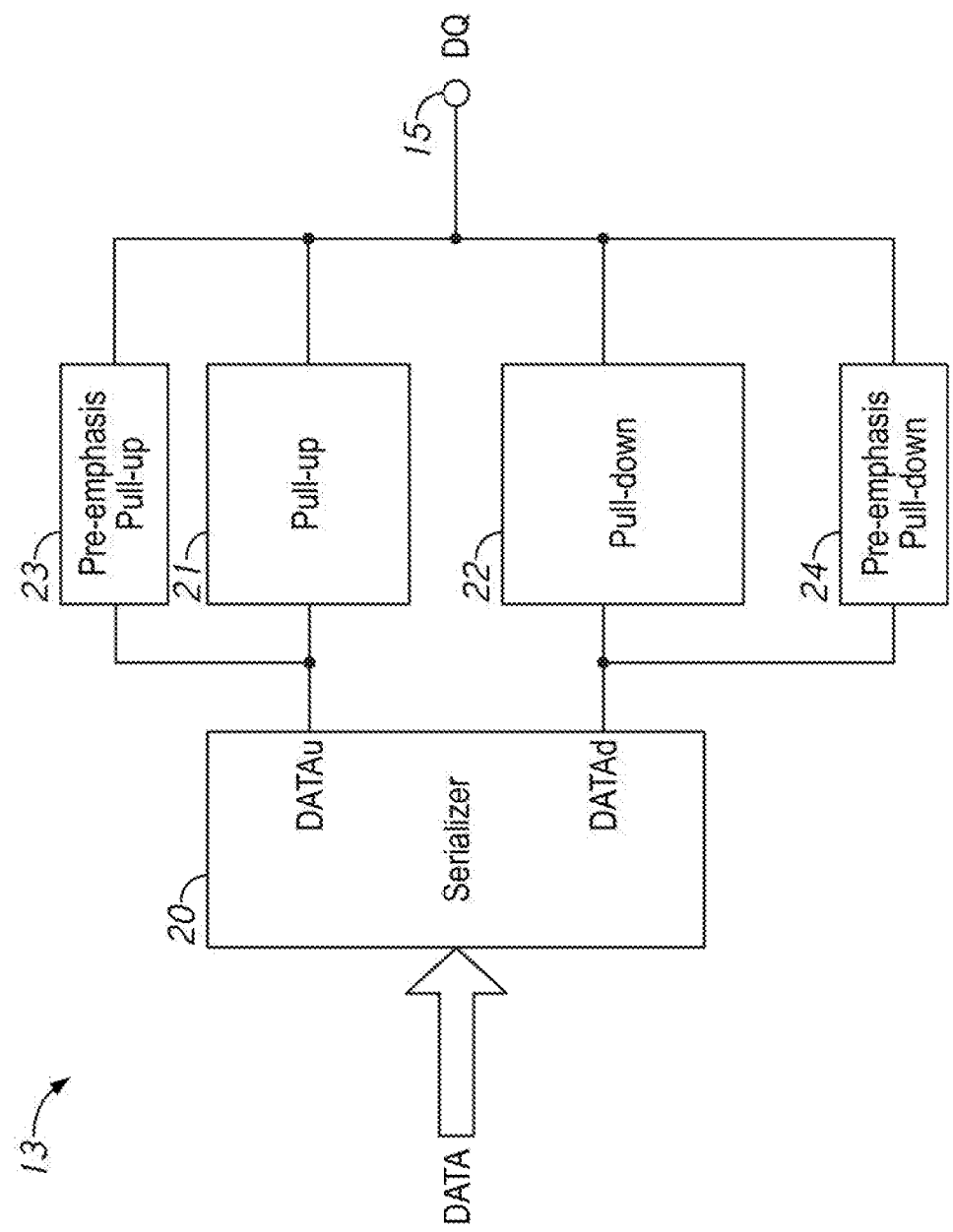
FIG. 2 is a block diagram showing a circuit of a data output system included in an I/O circuit.

FIG. 2 shows circuit blocks of a data output system included in the I/O circuit 13, which are associated with one data terminal 15. As shown in FIG. 2, the I/O circuit 13 includes a serializer 20 that converts parallel data DATA read out from the memory cell array 11 to serial data. The serial data output from the serializer 20 includes pull-up data DATAu and pull-down data DATAd. The pull-up data DATAu and the pull-down data DATAd are signals that may be complementary to each other.

The pull-up data DATAu is provided to a pull-up circuit 21 and a pre-emphasis circuit 23. The pull-up circuit 21 is activated in a pull-up operation, that is, when high-level read data DQ is output from the data terminal 15. As shown in FG. 3A, the pull-up circuit 21 includes three pull-up driver circuits 30H to 32H that belong to a high-speed path and three pull-up driver circuits 30L to 32L that belong to a low-speed path. Whether to use the high-speed path or the low-speed path is selected based on a speed mode signal Hs input to a driver circuit 28. In a case where the high-speed path is selected, one or two or more of the pull-up driver circuits 30H to 32H is/are selected based on a driver-strength selection signal DS. In a case where the low-speed path is selected, one or two or more of the pull-up driver circuits 30L to 32L is/are selected based on the driver-strength selection signal DS. The driver sizes of the pull-up driver circuits 30H to 32H may be different from one another. Similarly, the driver sizes of the pull-up driver circuits 30L to 32L may be different from one another. Each of the pull-up driver circuits 30H to 32H and 30L and 32L includes output impedance calibration circuits 50 to 53. These output impedance calibration circuits equally and selectively drive adjustment MOS transistors included in a plurality of output-stage circuits that have an equal impedance to one another based on an impedance selection signal ZQ in such a manner that an impedance per one output-stage circuit is calibrated to a desired value. The number of associated output-stage circuits is different among the pull-up driver circuits 30H/L to 32H/L. For example, the circuit 30H/L is associated with three output-stage circuits, the circuit 31H/L is associated with two output-stage circuits, and the circuit 32H/L is associated with one output-stage circuit. In this case, each of the output impedance calibration circuits 50 to 53 in the circuit 30H/L drives adjustment MOS transistors of three output-stage circuits, each of the output impedance calibration circuits 50 to 53 in the circuit 31H/L drives adjustment MOS transistors of two output-stage circuits, and each of the output impedance calibration circuits 50 to 53 in the circuit 32H/L drives an adjustment MOS transistor of one output-stage circuit. Therefore, it is possible to select an output impedance in a pull-up operation to be an accurate impedance with desired driver strength. In addition, the speed mode signal Hs and a slew-rate selection signal SR are also provided to the output impedance calibration circuits 50 to 53 in common.

Figure 3A:
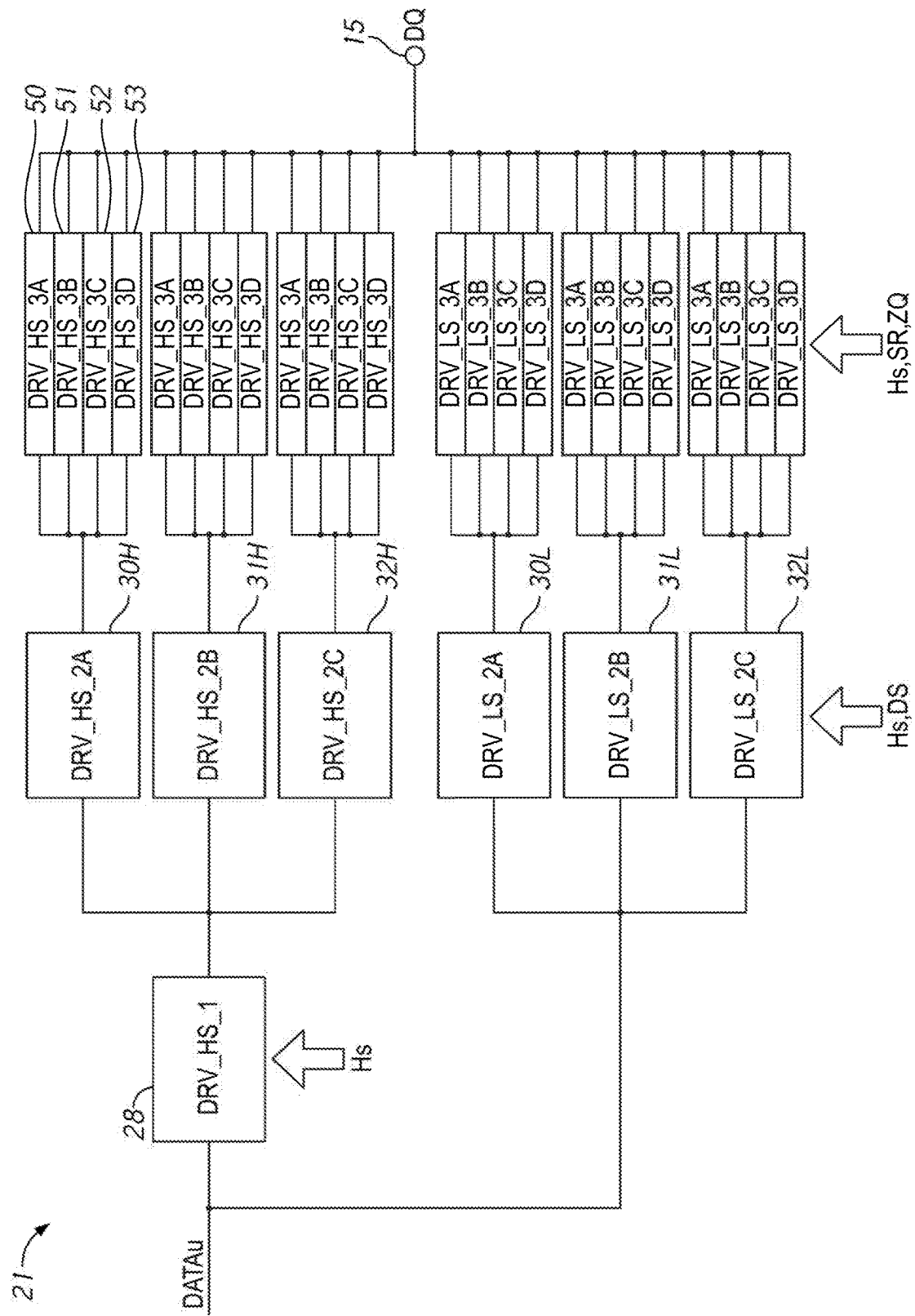
FIG. 3A is a block diagram showing a configuration of a pull-up circuit.
Figure 3B:
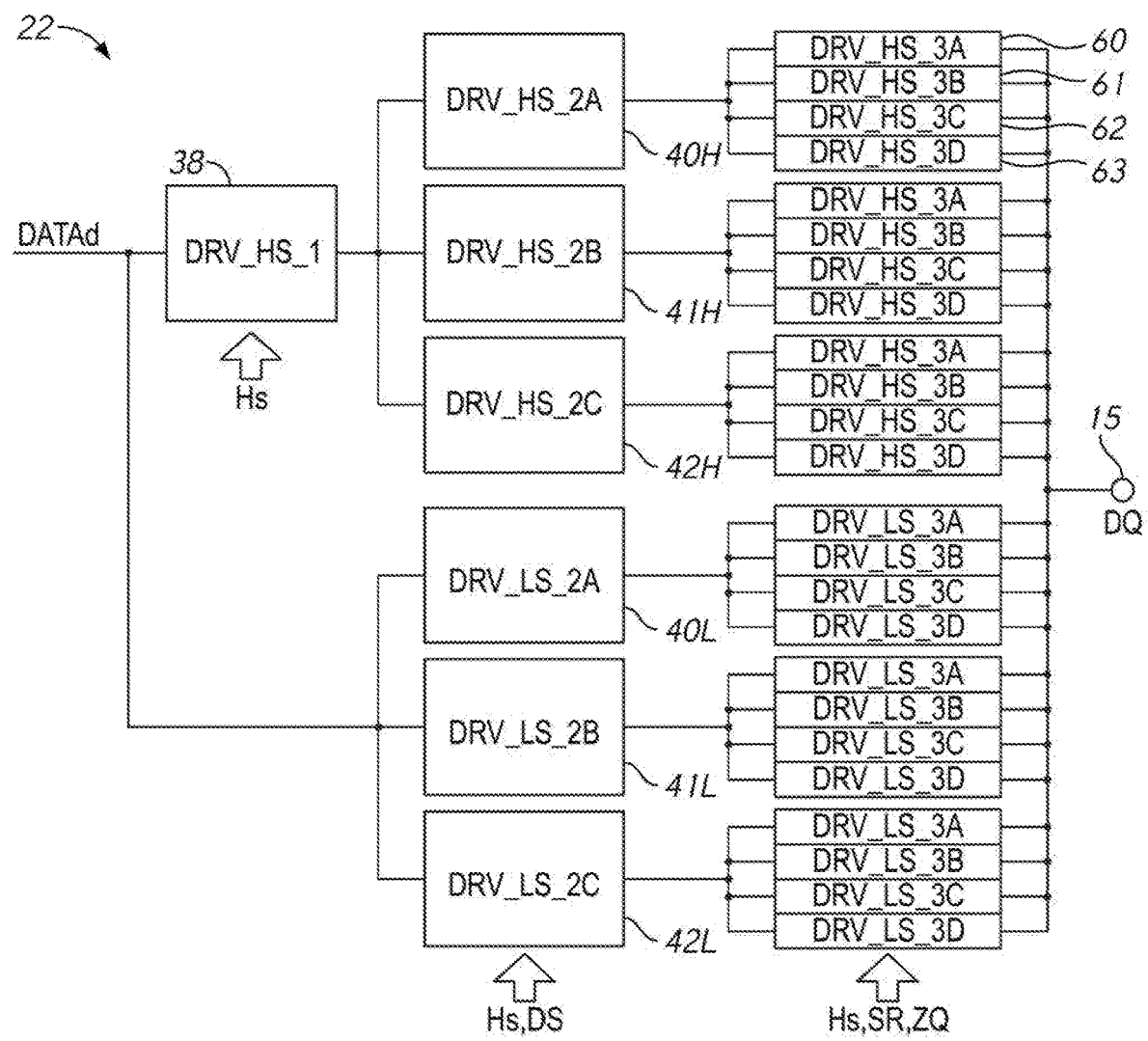
FIG. 3B is a block diagram showing a configuration of a pull-down circuit.

The pull-down data DATAd is provided to a pull-down circuit 22 and a pre-emphasis circuit 24. The pull-down circuit 22 is activated in a pull-down operation, that is, when low-level read data DQ is output from the data terminal 15. As shown in FIG. 3B, the pull-down circuit 22 includes three pull-down driver circuits 40H to 42H that belong to a high-speed path and three pull-down driver circuits 40L to 42L that belong to a low-speed path. Whether to use the high-speed path or the low-speed path is selected based on the speed mode signal Hs input to a driver circuit 38. In a case where the high-speed path is selected, one or two or more of the pull-down driver circuits 40H to 42H is/are selected based on the driver-strength selection signal DS. In a case where the low-speed path is selected, one or two or more of the pull-down driver circuits 40L to 42L is/are selected based on the driver-strength selection signal DS. The driver sizes of the pull-down driver circuits 40H to 42H may be different from one another. Similarly, the driver sizes of the pull-down driver circuits 40L to 42L may be different from one another. Each of the pull-down driver circuits 40H to 42H and 40L and 42L includes output impedance calibration circuits 60 to 63. These output impedance calibration circuits equally and selectively drive adjustment MOS transistors included in a plurality of output-stage circuits that have an equal impedance to one another based on the impedance selection signal ZQ in such a manner that an impedance per one output-stage circuit is calibrated to a desired value. The number of the associated output-stage circuits is different among the pull-down driver circuits 40H/L to 42H/L. For example, the circuit 40H/L is associated with three output-stage circuits, the circuit 41H/L is associated with two output-stage circuits, and the circuit 42H/L is associated with one output-stage circuit. In this case, each of the output impedance calibration circuits 60 to 63 in the circuit 40L drives adjustment MOS transistors of three output-stage circuits, each of the output impedance calibration circuits 60 to 63 in the circuit 41H/L drives adjustment MOS transistors of two output-stage circuits, and each of the output impedance calibration circuits 60 to 63 in the circuit 42H/L drives an adjustment MOS transistor of one output-stage circuit. Therefore, it is possible to select an output impedance in a pull-down operation to be an accurate impedance with desired driver strength. In addition, the speed mode signal Hs and the slew-rate selection signal SR are also provided to the output impedance calibration circuits 60 to 63 in common.

Each of the pre-emphasis circuits 23 and 24 temporarily lowers its output resistance only during a period of data transition, thereby compensating for loss by the skin effect and dielectric loss generated in a high-frequency operation. Therefore, it is possible to allow data transition to occur with an appropriate slew rate even in a high-frequency operation and to drive the data terminal 15 with a set resistance in a steady state.

Figure 4A:
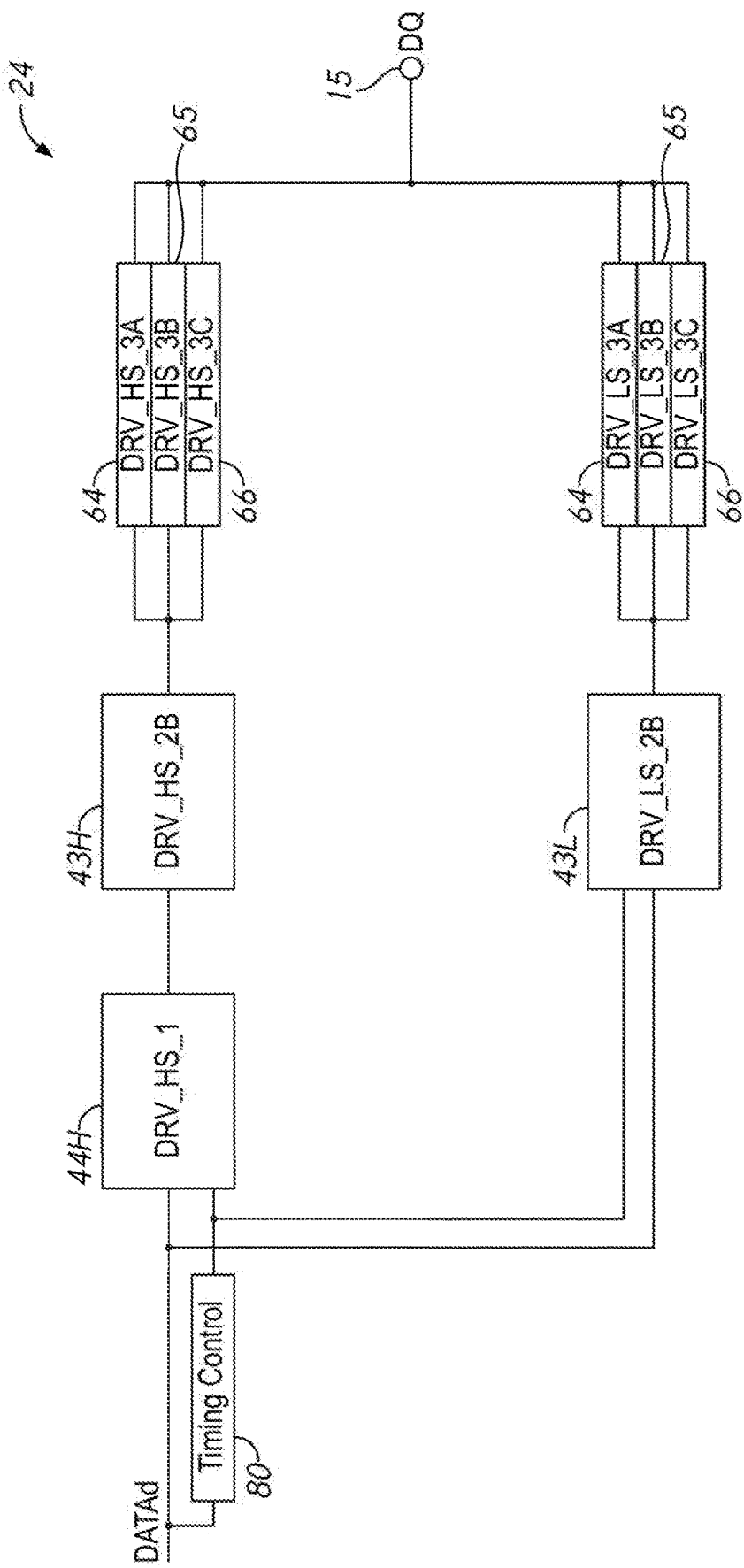
FIG. 4A is block diagram showing a configuration of a pull-down pre-emphasis circuit.
Figure 4B:
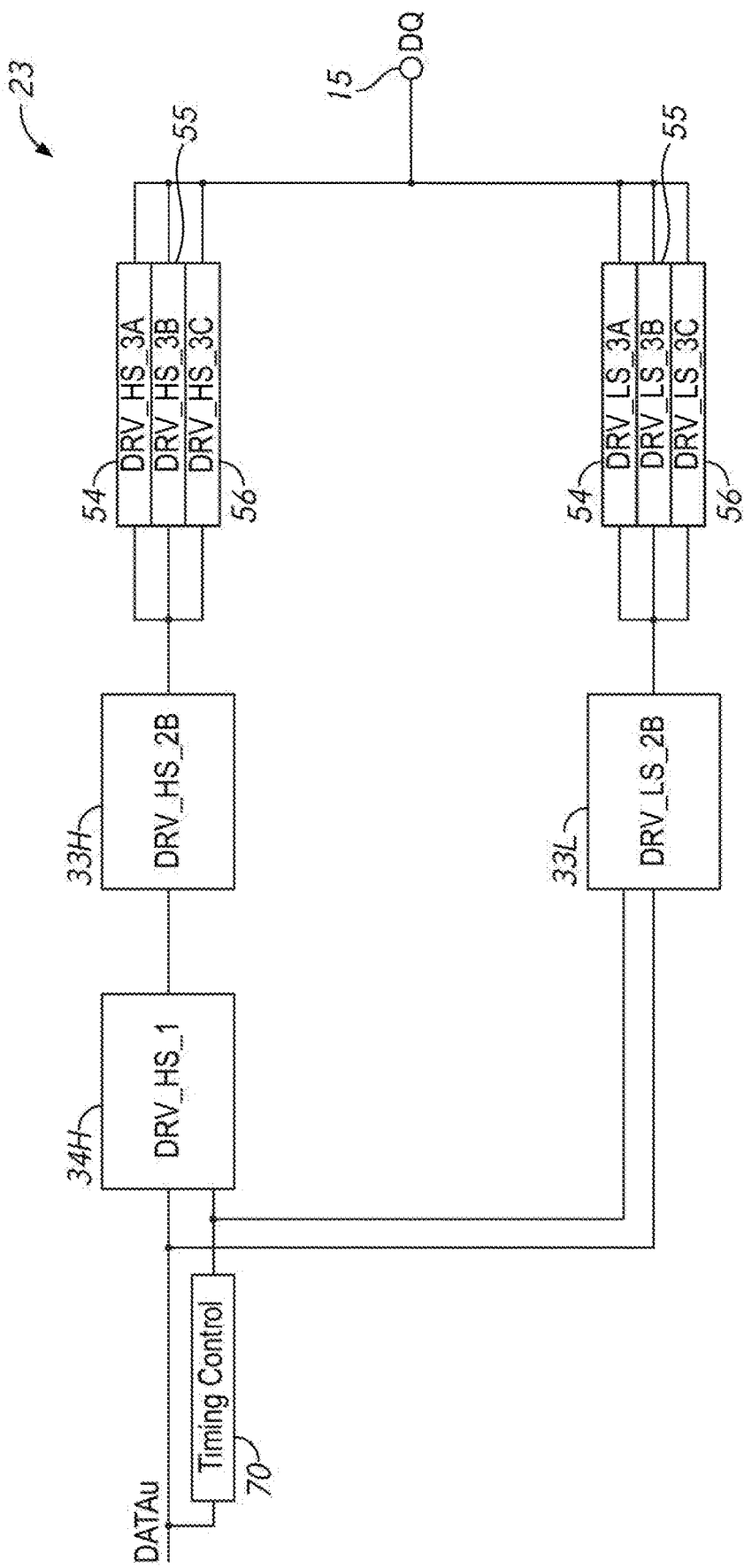
FIG. 4B is block diagram showing a configuration of a pull-up pre-emphasis circuit.

The pre-emphasis circuit 24 is activated when the read data DQ changes to a low level, thereby making a falling edge of the read data DQ steep. As shown in FIG. 4A, the pre-emphasis circuit 24 includes a pre-emphasis timing control circuit 80, pull-down driver circuits 43H and 44H that belong to a high-speed path, and a pull-down driver circuit 43L that belongs to a low-speed path. Each of the pull-down driver circuits 43H and 43L includes three driver circuits 64 to 66 that are selected by a pre-emphasis operation start signal /PEmpStr.

The pre-emphasis circuit 23 is activated when the read data DQ changes to a high level, thereby making a rising edge of the read data DQ steep. As shown in FG. 4B, the pre-emphasis circuit 23 includes a pre-emphasis timing control circuit 70, pull-up driver circuits 33H and 34H that belong to a high-speed path, and a pull-up driver circuit 33L that belongs to a low-speed path. Each of the pull-up driver circuits 33H and 33L includes three driver circuits 54 to 56 that are selected by the pre-emphasis operation start signal /PEmpStr.

While the example I/O circuit of FIG. 2 includes pre-emphasis circuit 23 and pre-emphasis circuit 24, in some embodiments of the disclosure an I/O circuit 13 includes one pre-emphasis circuit, for example, either a pull-up pre-emphasis circuit or a pull-down pre-emphasis circuit.

Figure 5:
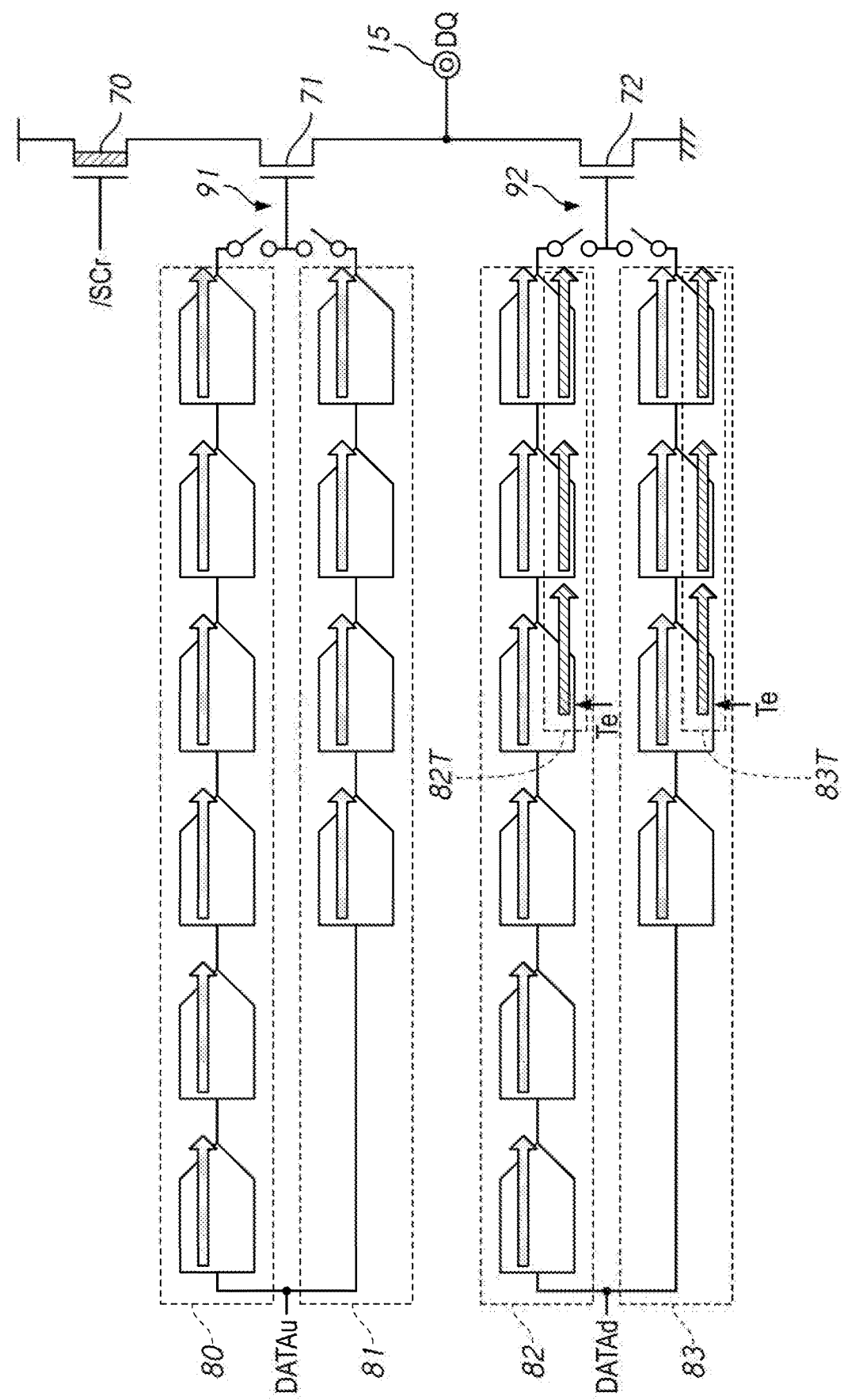
FIG. 5 is a schematic diagram for explaining flows of pull-up data and pull-down data.

FIG. 5 is a schematic diagram for explaining flows of the pull-up data DATAu and the pull-down data DATAd. As shown in FIG. 5, the pull-up data DATAu is provided to a gate electrode of an output transistor 71 via a high-speed path 80 or a low-speed path 81. The high-speed path 80 is smaller than the low-speed path 81 in fan out. The output transistor 71 is an N-channel MOS transistor. Whether to use the high-speed path 80 or the low-speed path 81 is selected based on a speed mode signal. Outputs of the high-speed path 80 and the low-speed path 81 are provided to the gate electrode of the output transistor 71 via a multiplexer 91. The pull-down data DATAd is provided to a gate electrode of an output transistor 72 via a high-speed path 82 or a low-speed path 83. The high-speed path 82 is smaller than the low-speed path 83 in fan out. The output transistor 72 is an N-channel MOS transistor. Whether to use the high-speed path 82 or the low-speed path 83 is selected based on the speed mode signal. Outputs of the high-speed path 82 and the low-speed path 83 are provided to the gate electrode of the output transistor 72 via a multiplexer 92. As shown in FIG. 5, both the high-speed paths 80 and 82 include gate circuits arranged in six stages, whereas both the low-speed paths 81 and 83 include gate circuits arranged in four stages.

In a case where the speed mode signal indicates a high-speed mode, the high-speed paths 80 and 82 are activated in a read operation and an ODT path 82T in the high-speed path 82 is activated in a target ODT operation. On the other hand, in a case where the speed mode signal indicates a low-speed mode, the low-speed paths 81 and 83 are activated in a read operation and an ODT path 83T in the low-speed path 83 is activated in a target ODT operation. The target ODT paths 82T and 83T are selected when a target ODT enable signal Te is activated. The target ODT enable signal Te is activated in a write operation. When the target ODT enable signal Te is activated, the pull-up side paths 80 and 81 and a portion of the pull-down side paths 82 and 83 other than the target ODT paths 82T and 83T are inactive.

A switching transistor 70, the output transistor 71, and the output transistor 72 are connected in series to one another between a high-potential side power line and a low-potential side power line. The switching transistor 70 is an N-channel MOS transistor in which a gate insulating film is formed to be thick, and a reset signal /SCr is provided to a gate electrode thereof. The reset signal SCr is an inverted signal of a reset signal SCr that becomes low in a read operation. The data terminal 15 is connected to a connecting point between the output transistor 71 and the output transistor 72. In FIG. 5 and the subsequent drawings, a transistor in which a straight line opposed to its gate electrode is denoted with a bold line is a transistor in which its gate insulating film is formed to be thick.

Figure 6A:
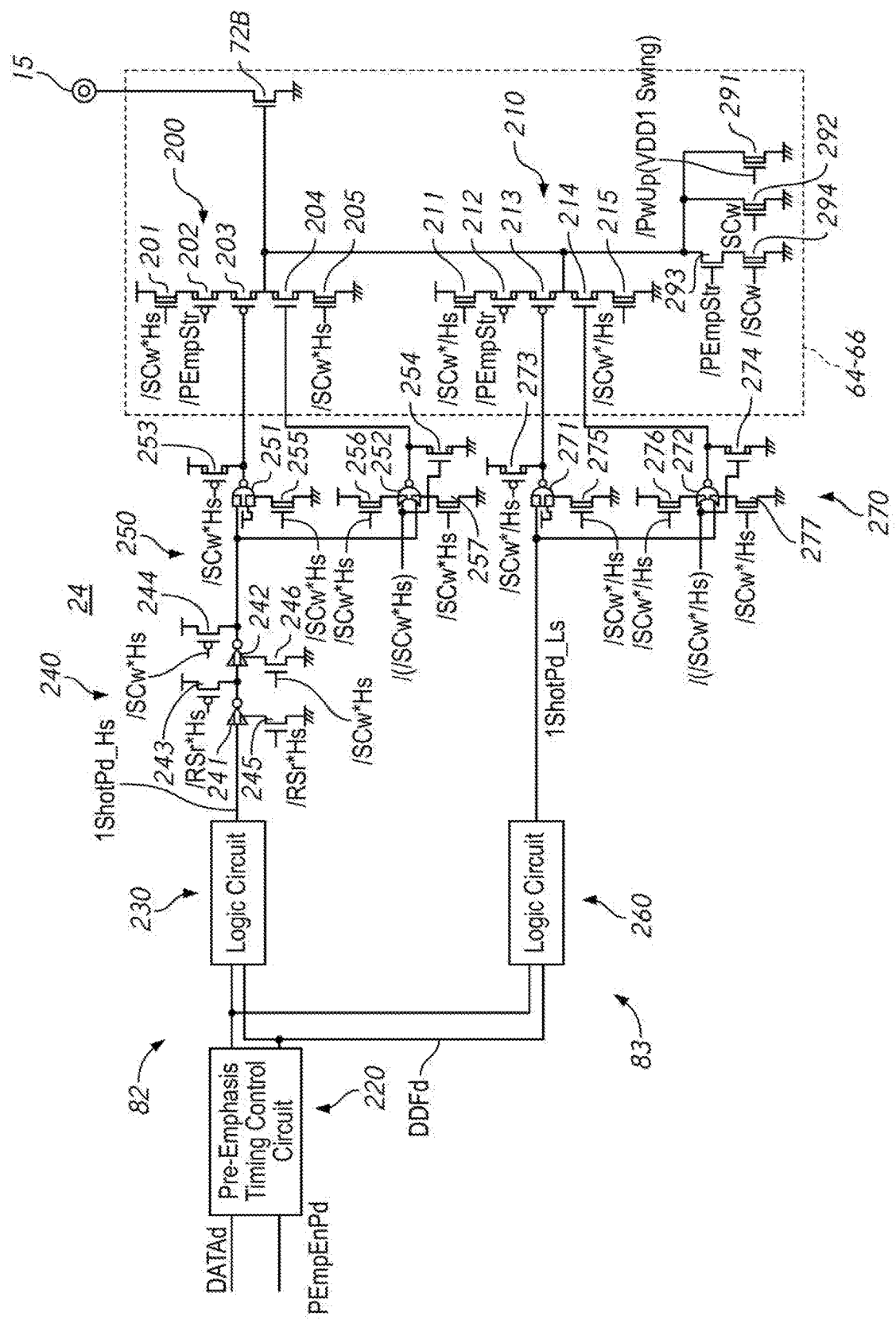
FIG. 6A is a circuit diagram showing a signal path in the pull-down circuit in more detail.

FIG. 6A is a circuit diagram of the pre-emphasis circuit 24. The pre-emphasis circuit 24 includes two tristate buffer circuits 200 and 210. Output nodes of the tristate buffer circuits 200 and 210 are connected to a gate electrode of an output transistor 72B in common. That is, the output nodes of the tristate buffer circuits 200 and 210 are connected in wired OR connection and configure the multiplexer 92 shown in FIG. 5. The output transistor 72B is one of the output transistors 72 shown in FIG. 5, which is included in the pre-emphasis circuit 24.

The tristate buffer circuit 200 belongs to the high-speed path 82 and includes transistors 201 to 205 that are connected in series to one another between a high-potential side power line and a low-potential side power line. The transistors 201 and 205 are N-channel MOS transistors, each of which has a gate insulating film formed to be thick, and the control signal /SCw*Hs is provided to gate electrodes thereof. A pre-emphasis operation start signal /PEmpStr is input to a gate electrode of the transistor 202. The transistor 203 is a P-channel MOS transistor that receives an output of a NAND gate circuit 251 included in a logic circuit 250 in a preceding stage. The transistor 204 is an N-channel MOS transistor that receives an output of a NOR gate circuit 252 included in the logic circuit 250 in the preceding stage. The transistors 202 to 204 respectively have a lowered threshold, and therefore can perform high-speed switching.

The pull-down data DATAd is provided to a pre-emphasis timing control circuit 220. The pre-emphasis timing control circuit 220 also receives a pull-down pre-emphasis enable signal PEmpEnPd. The pull-down pre-emphasis enable signal PEmpEnPd selects whether to perform a pre-emphasis operation at falling of the read data DQ. Therefore, in a case where the pull-down pre-emphasis enable signal PEmpEnPd is active at a high level, a timing control signal DDFd is generated from the pre-emphasis timing control circuit 220 based on the pull-down data DATAd.

The timing control signal DDFd and the pull-down data DATAd are input to the tristate buffer circuit 200 via logic circuits 230 and 240 and the logic circuit 250 included in the high-speed path 82. The logic circuit 230 receives the timing control signal DDFd and the pull-down data DATAd, and provides a pre-emphasis control signal 1ShotPd_Hs based on the timing control signal DDFd and the pull-down data DATAd. The pre-emphasis control signal 1ShotPd_Hs is provided to the logic circuit 240. The logic circuit 240 includes inverter circuits 241 and 242 connected to each other in cascade connection, transistors 243 and 244 that reset the high-speed path 82, and transistors 245 and 246 that activate the inverter circuits 241 and 242. The control signal /RSr*Hs is provided to gate electrodes of the transistors 243 and 245. The control signal /SCw*Hs is provided to gate electrodes of the transistors 244 and 246.

The logic circuit 250 includes the NAND gate circuit 251, the NOR gate circuit 252, a transistor 253 that fixes a gate electrode of the transistor 203 at a high level, a transistor 254 that fixes a gate electrode of the transistor 204 at a low level, a transistor 255 that activates the NAND gate circuit 251, and transistors 256 and 257 that activate the NOR gate circuit 252. An output signal of the logic circuit 240 and a high-level fixed signal are input to the NAND gate circuit 251. The output signal of the logic circuit 240 and the control signal /(/SCw*Hs) are input to the NOR gate circuit 252. The control signal /SCw*Hs is provided to gate electrodes of the transistors 253 and 255 to 257. The inverted signal /(/SCw*Hs) of the control signal /SCw*Hs is provided to a gate electrode of the transistor 254.

With this configuration, in a case where the speed mode signal Hs indicates a high-speed mode, the transistor 203 is temporarily turned on when the pull-down data DATAd changes to a high-level in a read operation. Therefore, the output transistor 72B is temporarily turned on, so that a pre-emphasis operation in a pull-down state is performed. On the other hand, in a case where the speed mode signal Hs indicates a low-speed mode, the output node of the tristate buffer circuit 200 is placed in a high-impedance state.

The tristate buffer circuit 210 belongs to the low-speed path 83 and includes transistors 211 to 215 that are connected in series to one another between a high-potential side power line and a low-potential side power line. The tristate buffer circuit 210 have the same circuit configuration as the tristate buffer circuit 200. The same signals as those input to the gate electrodes of the transistors 201, 202, and 205 are input to gate electrodes of the transistors 211, 212, and 215, except that the speed mode signal HS is inverted.

The timing control signal DDFd and the pull-down data DATAd are input to the tristate buffer circuit 210 via logic circuits 260 and 270 included in the low-speed path 83. The logic circuit 260 receives the timing control signal DDFd and the pull-down data DATAd, and provides a pre-emphasis control signal 1ShotPd_Ls based on the timing control signal DDFd and the pull-down data DATAd. The pre-emphasis control signal 1ShotPd_Ls is provided to the logic circuit 270. The logic circuit 270 includes a NAND gate circuit 271, a NOR gate circuit 272, a transistor 273 that fixes a gate electrode of the transistor 213 at a high level, a transistor 274 that fixes a gate electrode of the transistor 214 at a low level, a transistor 275 that activates the NAND gate circuit 271, and transistors 276 and 277 that activate the NOR gate circuit 272. The pre-emphasis control signal 1ShotPd_Ls of the logic circuit 260 and a high-level fixed signal are input to the NAND gate circuit 271. The pre-emphasis control signal 1ShotPd_Ls of the logic circuit 260 and a control signal /(/SCw*/Hs) are input to the NOR gate circuit 272. The control signal /SCw*/Hs is provided to gate electrodes of the transistors 273 and 275 to 277. The inverted signal /(/SCw*/Hs) of the control signal /SCw*/Hs is provided to a gate electrode of the transistor 274.

With this configuration, in a case where the speed mode signal Hs indicates a low-speed mode, the transistor 213 is temporarily turned on when the pull-down data DATAd changes to a high-level in a read operation. Therefore, the output transistor 72B is temporarily turned on, so that a pre-emphasis operation in a pull-down state is performed. On the other hand, in a case where the speed mode signal Hs indicates a high-speed mode, the output node of the tristate buffer circuit 210 is placed in a high-impedance state.

Further, the pre-emphasis circuit 24 includes N-channel MOS transistors 291 to 294 that reset the gate electrode of the output transistor 72B to a low level. The control signals /PwUp, SCw, and /PEmpStr and a control signal /SCw are provided to gate electrodes of the transistors 291 to 294, respectively. The transistors 291, 292, and 294 are N-channel MOS transistors, each of which has a gate insulating film formed to be thick. Further, the amplitude of the control signal /PwUp input to the transistor 291 is not the boosted potential VCCP but the external power potential VDD1. Meanwhile, the amplitudes of the control signals SCw and /SCw are VCCP, and the amplitude of the control signal /PEmpStr is VDD2.

In the pre-emphasis circuit 24, the driver circuits 64 to 66 are provided in parallel.

Figure 6B:
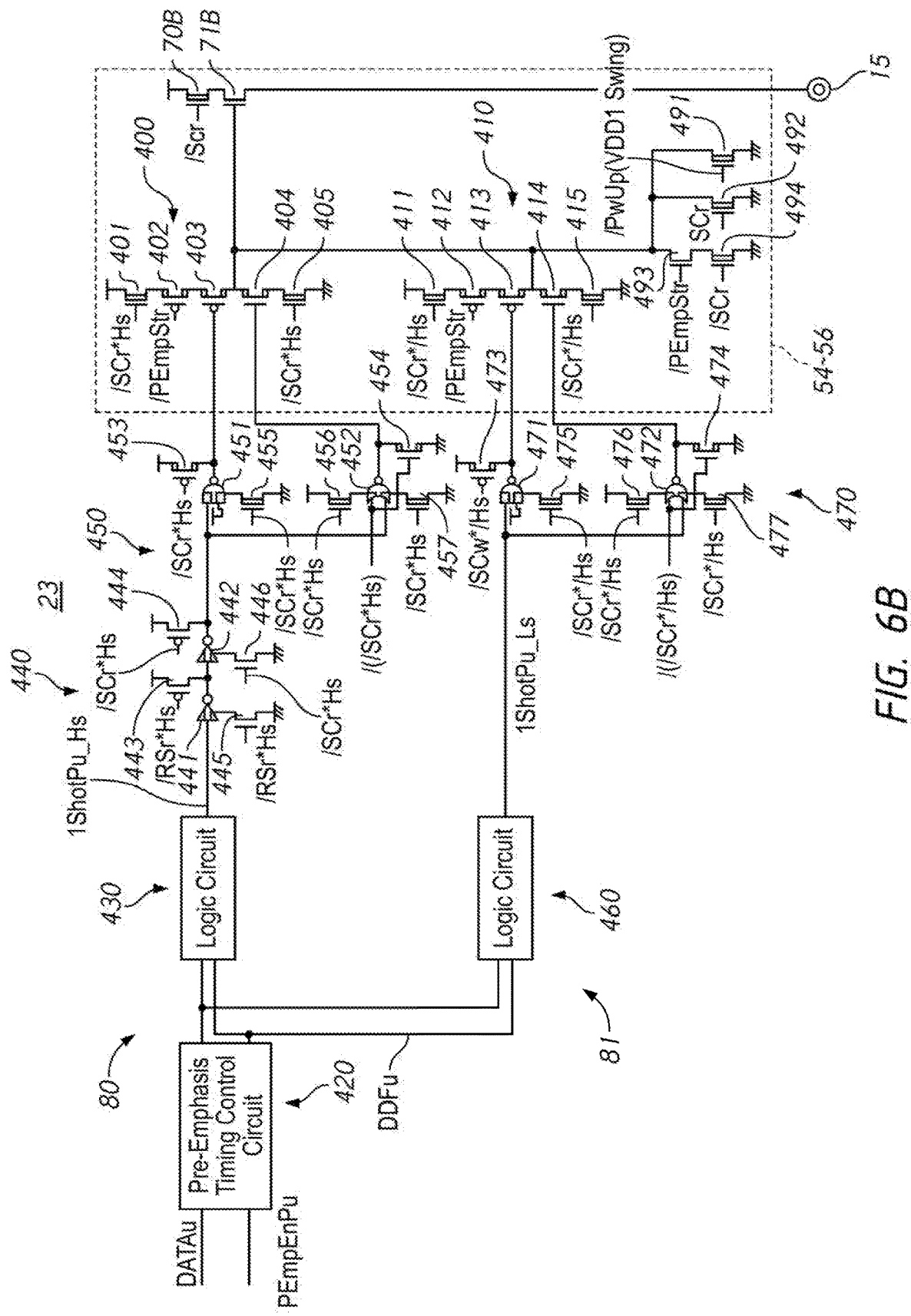
FIG. 6B is a circuit diagram showing a signal path in the pull-up circuit in more detail.

FIG. 6B is a circuit diagram of the pre-emphasis circuit 23. The pre-emphasis circuit 23 includes two tristate buffer circuits 400 and 410. Output nodes of the tristate buffer circuits 400 and 410 are connected to a gate electrode of an output transistor 71B in common. That is, the output nodes of the tristate buffer circuits 400 and 410 are connected in wired OR connection and configure the multiplexer 91 shown in FIG. 5. The output transistor 71B is one of the output transistors 71 shown in FIG. 5, which is included in the pre-emphasis circuit 23.

The tristate buffer circuit 400 belongs to the high-speed path 80 and includes transistors 401 to 405 that are connected in series to one another between a high-potential side power line and a low-potential side power line. The transistors 401 and 405 are N-channel MOS transistors, each of which has a gate insulating film formed to be thick, and the control signal /SCr*Hs is provided to gate electrodes thereof. The pre-emphasis operation start signal /PEmpStr is input to a gate electrode of the transistor 402. The transistor 403 is a P-channel MOS transistor that receives an output of a NAND gate circuit 451 included in a logic circuit 450 in a preceding stage. The transistor 404 is an N-channel MOS transistor that receives an output of a NOR gate circuit 452 included in the logic circuit 450 in the preceding stage. The transistors 402 to 404 respectively have a lowered threshold voltage, and therefore can perform high-speed switching.

The pull-up data DATAu is provided to a pre-emphasis timing control circuit 420. The pre-emphasis timing control circuit 420 also receives a pull-up pre-emphasis enable signal PEmpEnPu. The pull-up pre-emphasis enable signal PEmpEnPu selects whether to perform a pre-emphasis operation at rising of the read data DQ. Therefore, in a case where the pull-up pre-emphasis enable signal PEmpEnPu is active at a high level, a timing control signal DDFu is generated from the pre-emphasis timing control circuit 420 based on the pull-down data DATAu.

The timing control signal DDFu and the pull-up data DATAu are input to the tristate buffer circuit 400 via logic circuits 430 and 440 and the logic circuit 450 that are included in the high-speed path 80. The logic circuit 430 receives the timing control signal DDFu and the pull-up data DATAu, and provides a pre-emphasis control signal 1ShotPu_Hs based on the timing control signal DDFu and the pull-up data DATAu. The pre-emphasis control signal 1ShotPu_Hs is provided to the logic circuit 440. The logic circuit 440 includes inverter circuits 441 and 442 connected to each other in cascade connection, transistors 443 and 444 that reset the high-speed path 80, and transistors 445 and 446 that activate the inverter circuits 441 and 442. The control signal /RSr*Hs is provided to gate electrodes of the transistors 443 and 445. The control signal /SCr*Hs is provided to gate electrodes of the transistors 444 and 446.

The logic circuit 450 includes the NAND gate circuit 451, the NOR gate circuit 452, a transistor 453 that fixes a gate electrode of the transistor 403 at a high level, a transistor 454 that fixes a gate electrode of the transistor 404 at a low level, a transistor 455 that activates the NAND gate circuit 451, and transistors 456 and 457 that activate the NOR gate circuit 452. An output signal of the logic circuit 440 and a high-level fixed signal are input to the NAND gate circuit 451. The output signal of the logic circuit 440 and the control signal /(/SCr*Hs) are input to the NOR gate circuit 452. The control signal /SCr*Hs is provided to gate electrodes of the transistors 453 and 455 to 457. The inverted signal /(/SCr*Hs) of the control signal /SCr*Hs is provided to a gate electrode of the transistor 454. The power potential VDD2 lower than the boosted potential VCCP is used for the control signal /SCr*Hs used in the logic circuits 430 and 440, whereas the boosted potential VCCP is used for the control signal /SCr*/Hs used in the logic circuit 450 and subsequent circuits for driving a thick film transistor.

With this configuration, in a case where the speed mode signal Hs indicates a high-speed mode, the transistor 403 is temporarily turned on when the pull-up data DATAu changes to a high-level in a read operation. Therefore, the output transistor 71B is temporarily turned on, so that a pre-emphasis operation in a pull-up state is performed. On the other hand, in a case where the speed mode signal Hs indicates a low-speed mode, the output node of the tristate buffer circuit 400 is placed in a high-impedance state.

The tristate buffer circuit 410 belongs to the low-speed path 81 and includes transistors 411 to 415 that are connected in series to one another between a high-potential side power line and a low-potential side power line. The tristate buffer circuit 410 have the same circuit configuration as the tristate buffer circuit 400. The same signals as those input to the gate electrodes of the transistors 401, 402, and 405 are input to gate electrodes of the transistors 411, 412, and 415, except that the speed mode signal Hs is inverted.

The timing control signal DDFu and the pull-up data DATAu are input to the tristate buffer circuit 410 via logic circuits 460 and 470 included in the low-speed path 81. The logic circuit 460 receives the timing control signal DDFu and the pull-up data DATAu, and provides a pre-emphasis control signal 1ShotPu_Ls based on the timing control signal DDFu and the pull-up data DATAu. The pre-emphasis control signal 1ShotPu_Ls is provided to the logic circuit 470. The logic circuit 470 includes a NAND gate circuit 471, a NOR gate circuit 472, a transistor 473 that fixes a gate electrode of the transistor 413 at a high level, a transistor 474 that fixes a gate electrode of the transistor 414 at a low level, a transistor 475 that activates the NAND gate circuit 471, and transistors 476 and 477 that activate the NOR gate circuit 472. The pre-emphasis control signal 1ShotPu_Ls of the logic circuit 460 and a high-level fixed signal are input to the NAND gate circuit 471. The pre-emphasis control signal 1ShotPu_Ls of the logic circuit 460 and the control signal /(/SCr*/Hs) are input to the NOR gate circuit 472. The control signal /SCr*/Hs is provided to gate electrodes of the transistors 473 and 475 to 477. The inverted signal /(/SCr*/Hs) of the control signal /SCr*/Hs is provided to a gate electrode of the transistor 474.

With this configuration, in a case where the speed mode signal Hs indicates a low-speed mode, the transistor 413 is temporarily turned on when the pull-up data DATAu changes to a high-level in a read operation. Therefore, the output transistor 71B is temporarily turned on, so that a pre-emphasis operation in a pull-up state is performed. On the other hand, in a case where the speed mode signal Hs indicates a high-speed mode, the output node of the tristate buffer circuit 410 is placed in a high-impedance state.

Further, the pre-emphasis circuit 23 includes N-channel MOS transistors 491 to 494 that reset the gate electrode of the output transistor 71B to a low level. The control signals /PwUp, SCr, /PEmpStr, and/SCr are provided to gate electrodes of the transistors 491 to 494, respectively. The transistors 491, 492, and 494 are N-channel MOS transistors, each of which has a gate insulating film formed to be thick. Further, the amplitude of the control signal /PwUp input to the transistor 491 is not the boosted potential VCCP but the external power potential VDD1. Meanwhile, the amplitudes of the control signals SCr, /PEmpStr, and/SCr are VCCP.

Figure 7:
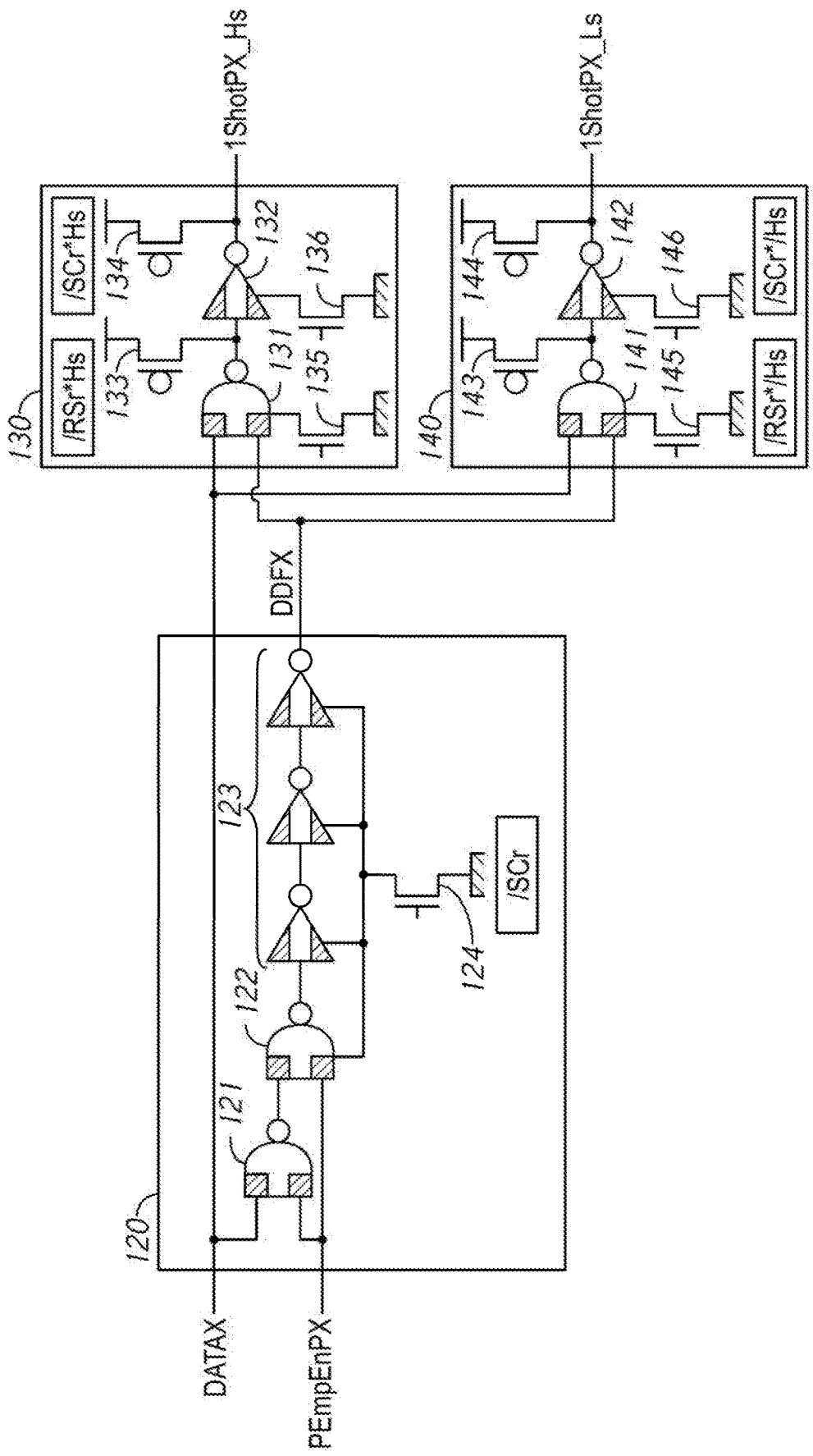
FIG. 7 is a schematic diagram of a pre-emphasis timing control circuit and logic circuits.

FIG. 7 is a schematic diagram of a pre-emphasis timing control circuit 120 and logic circuits 130 and 140. The pre-emphasis timing control circuit 120 may be used for controlling the timing of providing pre-emphasis by a pre-emphasis circuit. The logic circuits 130 and 140 provide respective pre-emphasis control signals 1shotPX_Hs and 1shotPX_Ls having a timing as controlled by the pre-emphasis timing control circuit 120. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data.

The pre-emphasis timing control circuit 120 includes a NAND gate circuit 121 that receives data activation signal DATAX and a pre-emphasis enable signal PEmpEnPX, a NAND gate circuit 122 that receives an output signal of the NAND gate circuit 121 and the pre-emphasis enable signal PEmpEnPX, inverter circuits 123 that are connected in cascade connection as a subsequent stage of the NAND gate circuit 122, where the number of the inverter circuits 123 being an odd number, and an N-channel MOS transistor 124 that provides power to the NAND gate circuits 121 and 122 and the inverter circuits 123. A reset signal /SCr is provided to a gate electrode of the transistor 124. The pre-emphasis enable signal PEmpEnPX selects whether to perform a pre-emphasis operation at a transition of the read data DQ.

Therefore, in a case where the pre-emphasis enable signal PEmpEnPX is active at a high level, a timing control signal DDFX is generated from the pre-emphasis timing control circuit 120 based on the data activation signal DATAX.

The logic circuit 130 may be included in a high-speed path for data. The logic circuit 130 includes a NAND gate circuit 131 that receives the timing control signal DDFX and the data activation signal DATAX, an inverter circuit 132, transistors 133 and 134 that reset the high-speed path, and transistors 135 and 136 that activate the NAND gate circuit 131 and the inverter circuit 132. A control signal /RSr*Hs is provided to gate electrodes of the transistors 133 and 135. A control signal /SCr*Hs is provided to gate electrodes of the transistors 134 and 136.

The logic circuit 140 may be included in a low-speed path for data. The logic circuit 140 includes a NAND gate circuit 141 that receives the timing control signal DDFX and the data activation signal DATAX, an inverter circuit 142, transistors 143 and 144 that reset the low-speed path, and transistors 145 and 146 that activate the NAND gate circuit 141 and the inverter circuit 142. The control signal /RSr*/Hs is provided to gate electrodes of the transistors 143 and 145. The control signal /SCr*/Hs is provided to gate electrodes of the transistors 144 and 146.

A pull-up data path may include respective pre-emphasis timing control circuit 120 and logic circuits 130 and 140 and a pull-down data path may also include respective pre-emphasis timing control circuit 120 and logic circuits 130 and 140.

Figure 8:
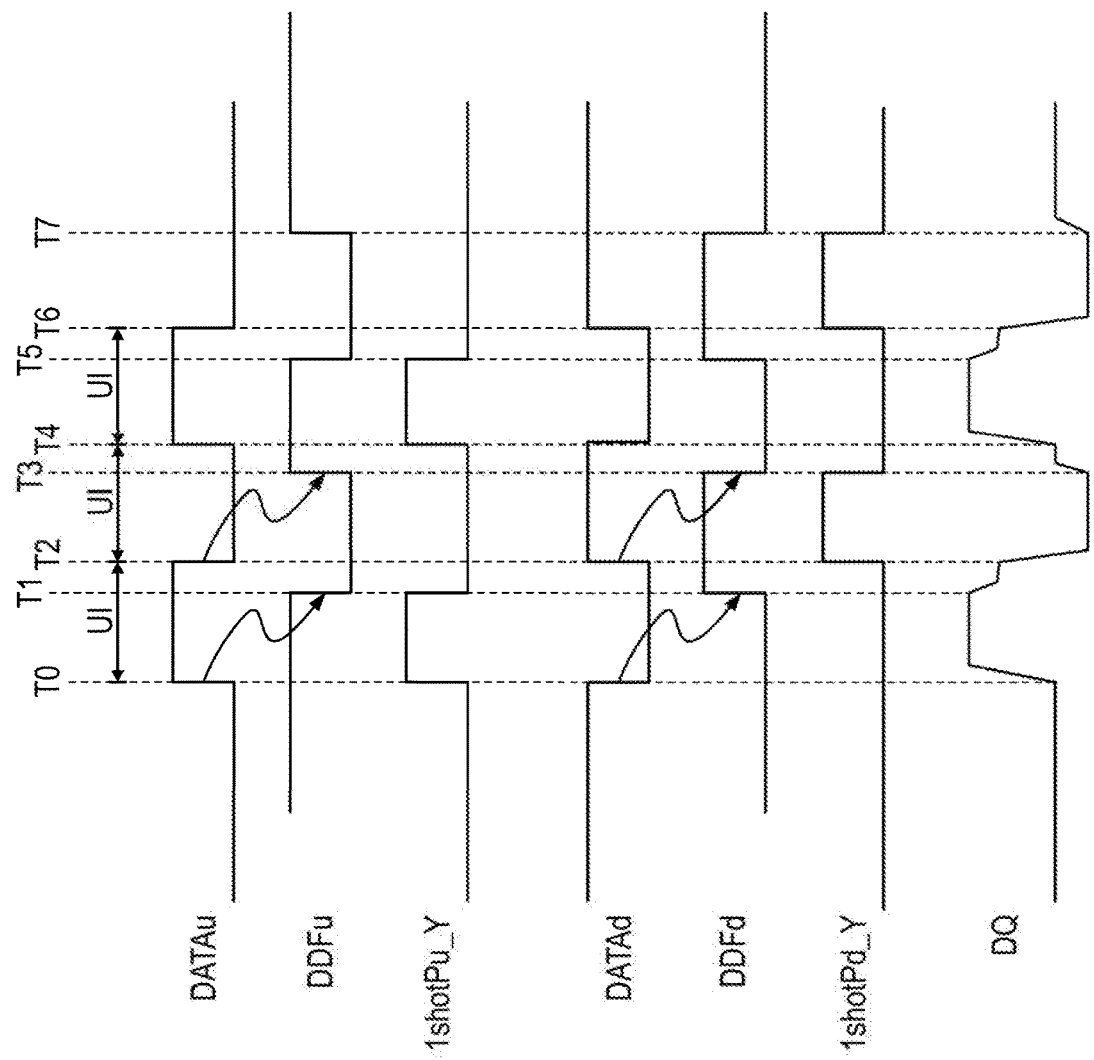
FIG. 8 is a timing diagram of various signals during operation of the pre-emphasis timing control circuit and logic circuits of FIG. 7.

Operation of the pre-emphasis timing control circuit 120 and logic circuits 130 and 140 will be described with reference to FIG. 8. FIG. 8 is a timing diagram of various signals during operation of the pre-emphasis timing control circuit 120 and logic circuits 130 and 140 of FIG. 7. FIG. 8 illustrates pull-up and pull-down data activation signals DATAu and DATAd for three unit intervals UI (e.g., three bits of data, 1, 0, and 1), timing control signals DDFu and DDFd, and pre-emphasis control signals 1shotPu_Y and 1shotPd_Y. The pull-up data activation signals DATAu, timing control signal DDFu, and pre-emphasis control signal shotPu_Y are related to a pull-up data path, and the pull-down data activation signals DATAd, timing control signal DDFd, and pre-emphasis control signal 1shotPd_Y are related to a pull-down data path. An output data signal DQ is also illustrated to show the effect of the pre-emphasis operation resulting from the pull-up and pull-down data activation signals DATAu and DATAd.

At time T0, the pull-up data activation signal DATAu changes to a high logic level (and the pull-down data activation signal DATAd changes to a low logic level). As a result, the pre-emphasis control signal 1shotPu_Y changes to a high logic level, and the output data signal DQ is driven to a high logic level with pre-emphasis, which is a pre-emphasis high logic voltage (e.g., a pumped high voltage) during pre-emphasis. At time T1 the timing control signal DDFu changes to a low logic level based on the rising edge of the pull-up data activation signal DATAu and the timing control signal DDFd changes to a high logic level based on the falling edge of the pull-down data activation signal DATAd. The low logic level timing control signal DDFu causes the pre-emphasis control signal 1shotPu_Y to change to a low logic level. As a result, a pre-emphasis is no longer applied for the output data signal DQ, and the output data signal changes from a pre-emphasis high logic voltage to nominal high logic level voltage.

At time T2, the pull-up data activation signal DATAu changes to a low logic level (and the pull-down data activation signal DATAd changes to a high logic level). As a result, the pre-emphasis control signal 1shotPd_Y changes to a high logic level, and the output data signal DQ is driven to a low logic level with pre-emphasis, which is a pre-emphasis low logic voltage (e.g., a pumped low voltage) during pre-emphasis. At time T3 the timing control signal DDFd changes to a low logic level based on the rising edge of the pull-down data activation signal DATAd and the timing control signal DDFu changes to a high logic level based on the falling edge of the pull-up data activation signal DATAu. The low logic level timing control signal DDFd causes the pre-emphasis control signal 1shotPd_Y to change to a low logic level. As a result, a pre-emphasis is no longer applied for the output data signal DQ, and the output data signal changes from a pre-emphasis low logic voltage to nominal low logic level voltage.

At time T4, the pull-up data activation signal DATAu again changes to a high logic level (and the pull-down data activation signal DATAd changes to a low logic level). The timing control signals DDFu and DDFd, and the pre-emphasis control signal 1shotPu_Y change as previously described between times T0 and T1. As a result, the pre-emphasis is also applied as previously described between times T0 and T. Similarly, at time T6, the pull-up data activation signal DATAu again changes to a low logic level (and the pull-down activation data signal DATAd changes to a high logic level). The timing control signals DDFu and DDFd, and the pre-emphasis control signal 1shotPd_Y change as previously described between times T2 and T3. As a result, the pre-emphasis is also applied as previously described between times T2 and T3.

As shown by the example operation of FIG. 8, pre-emphasis is applied for a portion of a UI when the pull-up (and pull-down) data activation signals DATAu and DATAd change logic levels, indicating the output data signal DQ is to change.

Figure 9:
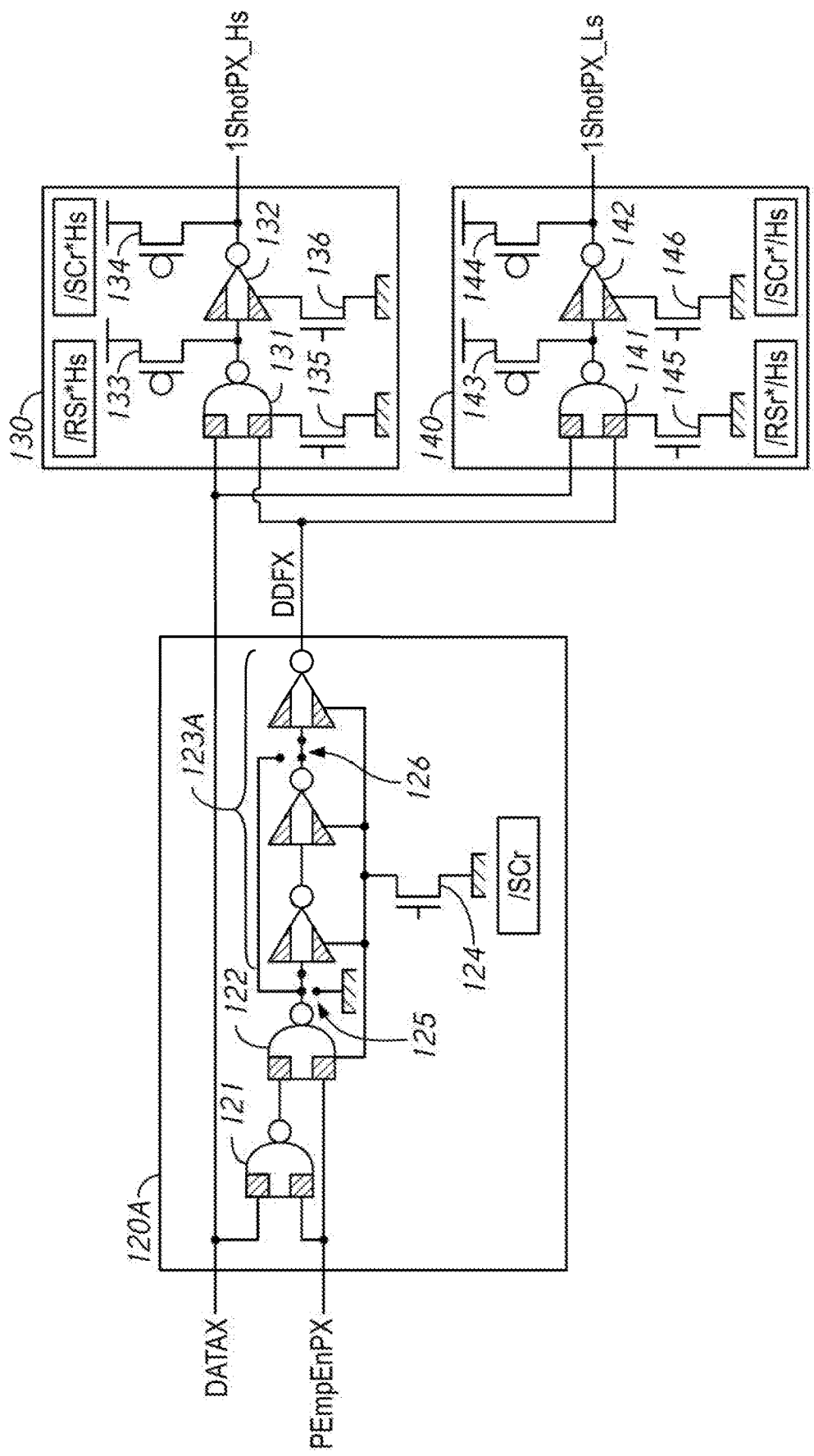
FIG. 9 is a block diagram of a pre-emphasis timing control circuit and logic circuits.

FIG. 9 is a block diagram of a pre-emphasis timing control circuit 120A and logic circuits 130 and 140. The pre-emphasis timing control circuit 120A may be used for controlling the timing of providing pre-emphasis by a pre-emphasis circuit. The logic circuits 130 and 140 are as previously described with reference to FIG. 7. As previously described with reference to FIG. 7, the logic circuits 130 and 140 provide respective pre-emphasis control signals 1shotPX_Hs and 1shotPX_Ls. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data. The timing of the pre-emphasis control signals 1shotPX_Hs and 1shotPX_Ls are controlled by the pre-emphasis timing control circuit 120A in FIG. 9.

The pre-emphasis timing control circuit 120A is similar to the pre-emphasis timing control circuit 120 previously described with reference to FIG. 7. However, the pre-emphasis timing control circuit 120A includes inverters 123A that are connected through switches 125 and 126 in cascade connection as a subsequent stage of the NAND gate circuit 122. In comparison to the inverters 123 of FIG. 7, the switches 125 and 126 may be used to demonstrate the effect of altering the timing of the timing control signal DDFX on application of pre-emphasis. In the example of FIG. 9, the switches 125 and 126 couple the three inverters 123A to provide three inverters of delay. In the example of FIG. 9, the resulting delay through the three inverters 123A may be relatively greater than the delay of inverters 123 of FIG. 7. As will be described in greater detail below, a relatively greater delay causes the timing of the pre-emphasis control signals 1shotPX_Hs and 1shotPX_Ls to change such that the pre-emphasis may be misapplied to the output data signal DQ.

Figure 10:
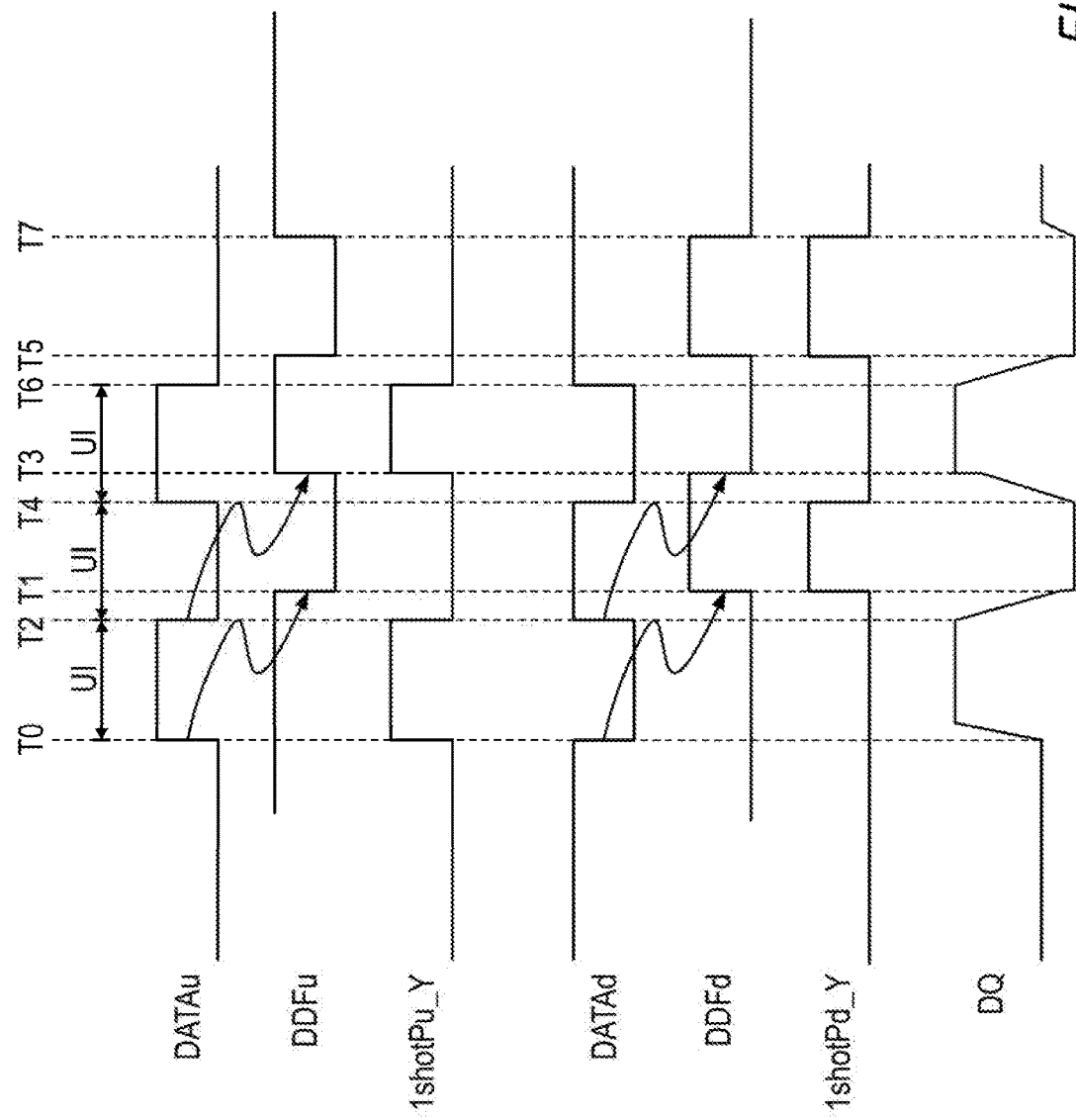
FIG. 10 is a timing diagram of various signals during operation of the pre-emphasis timing control circuit and logic circuits of FIG. 9.

The relatively greater delay of the inverters 123A and the altered timing of the pre-emphasis control signals 1shotPX_Hs and 1shotPX_Ls will be described with reference to FIG. 10. FIG. 10 is a timing diagram of various signals during operation of the pre-emphasis timing control circuit 120A and logic circuits 130 and 140 of FIG. 9. FIG. 10 illustrates pull-up and pull-down data activation signals DATAu and DATAd for three unit intervals (e.g., three bits of data, 1, 0, and 1), timing control signals DDFu and DDFd, and pre-emphasis control signals 1shotPu_Y and 1shotPd_Y.

At time T0, the pull-up data activation signal DATAu changes to a high logic level (and the pull-down data activation signal DATAd changes to a low logic level). As a result, the pre-emphasis control signal 1shotPu_Y changes to a high logic level, and the output data signal DQ is driven to a high logic level with pre-emphasis, which is a pre-emphasis high logic voltage (e.g., a pumped high voltage) during pre-emphasis.

At time T1 the timing control signal DDFu changes to a low logic level based on the rising edge of the pull-up data activation signal DATAu and the timing control signal DDFd changes to a high logic level based on the falling edge of the pull-down activation signal DATAd. In contrast to the example of FIG. 8, the greater delay of the inverters 123A causes the timing control signal DDFu and DDFd to change relatively later, for example, after a falling edge of the pull-up data activation signal DATAu (and after a rising edge of the pull-down data activation signal DATAd). As a result, pre-emphasis control signal 1shotPu_Y remains high until time T2 when the pull-up activation signal changes to a low logic level, and the output data signal DQ remains at the pre-emphasis high logic voltage for the entire UI.

Additionally, the relatively late rising edge of the timing control signal DDFd causes a relatively late rising edge of the pre-emphasis control signal 1shotPd_Y at time T1, which results in a late application of the pre-emphasis due to the delayed pre-emphasis control signal 1shotPd_Y. As shown in FIG. 10, the late application of the pre-emphasis results in a slower transition of the output data signal DQ from the pre-emphasis high logic voltage at time T2 to a pre-emphasis low logic voltage.

The relatively late rising edges of the timing control signals DDFu and DDFd occur again at times T3 and T5, which again cause delayed pre-emphasis control signals 1shotPu_Y and 1shotPd_Y and late application of the pre-emphasis. With the pre-emphasis applied late, the transitions of the output data signal DQ are relatively slower compared to application of correctly timed pre-emphasis.

Figure 11:
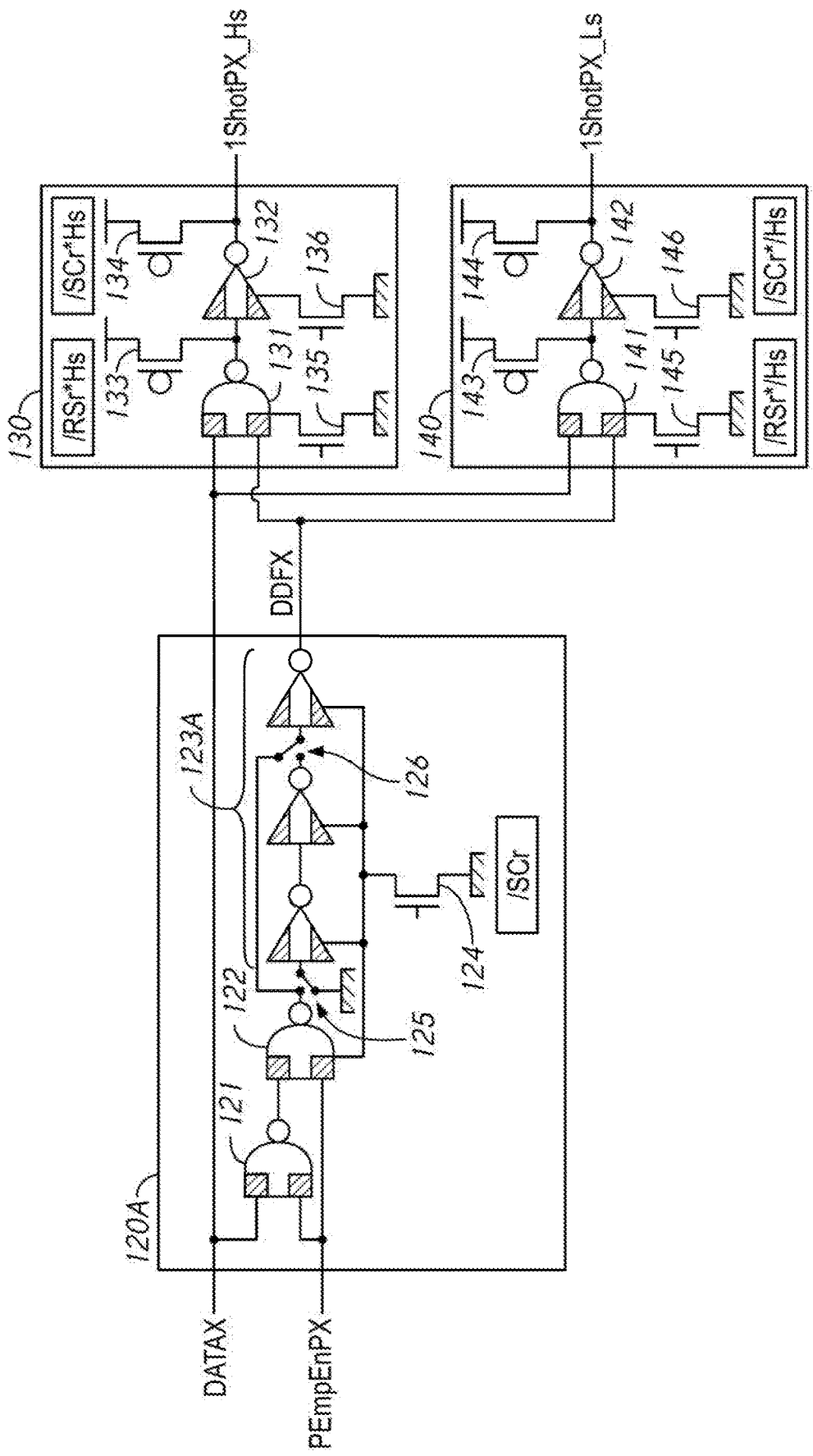
FIG. 11 is a block diagram of a pre-emphasis timing control circuit and logic circuits.
Figure 12:
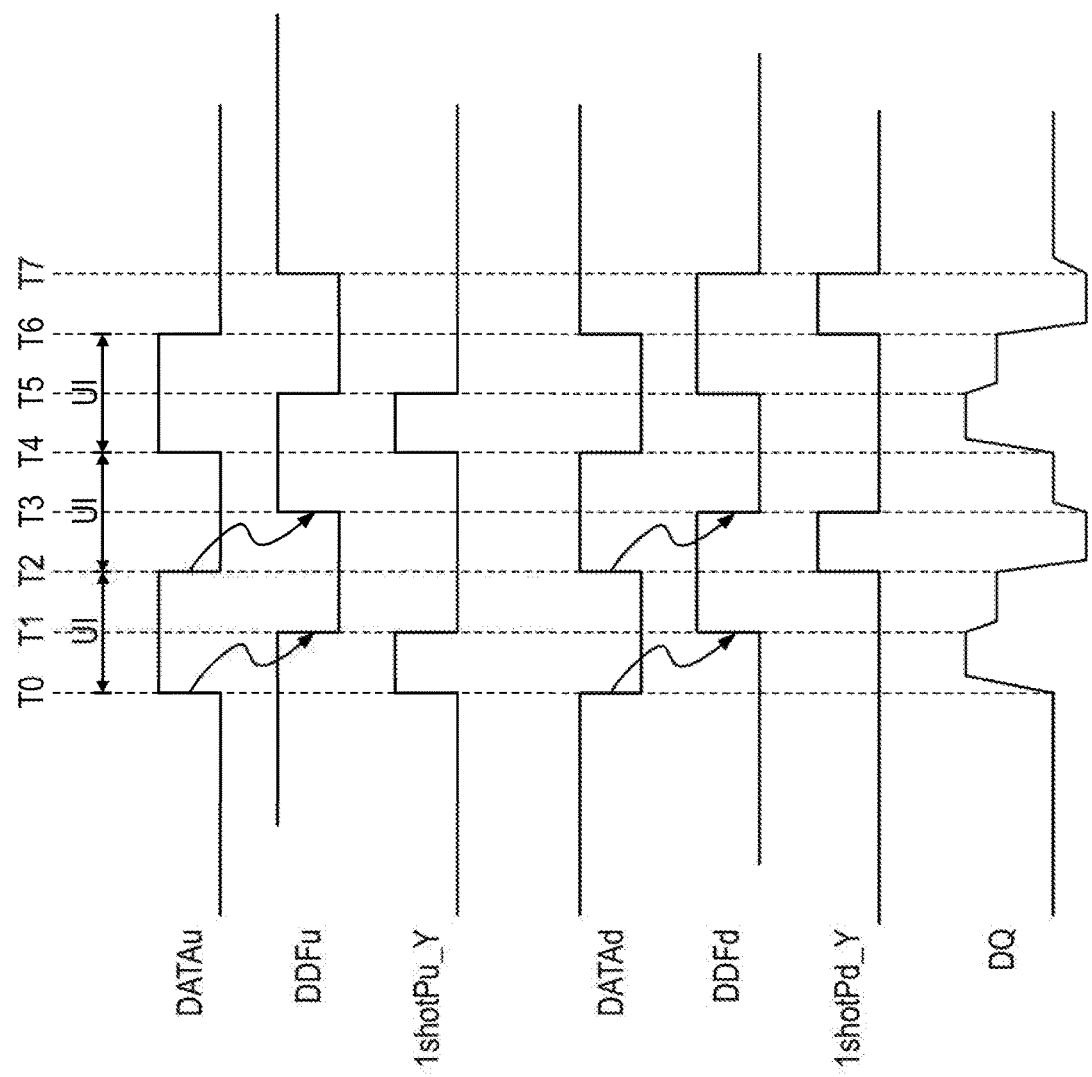
FIG. 12 is a timing diagram of various signals during operation of the pre-emphasis timing control circuit and logic circuits of FIG. 11.

The pre-emphasis timing control circuit 120A and logic circuits 130 and 140 are again shown in FIG. 11. However, the switches 125 and 126 are used to bypass two inverters to provide a delay of one inverter. The resulting delay through the one inverter is relatively shorter than the delay of the three inverters previously described with reference to FIG. 7. As a result, while the timing of application of pre-emphasis is correct, the duration of the pre-emphasis is shorter relative to the example of FIG. 8. The relatively short pre-emphasis is shown in FIG. 12. FIG. 12 is a timing diagram of various signals during operation of the pre-emphasis timing control circuit 120A and logic circuits 130 and 140 of FIG. 11.

At time T0, the pull-up data activation signal DATAu changes to a high logic level (and the pull-down data activation signal DATAd changes to a low logic level). As a result, the pre-emphasis control signal 1shotPu_Y changes to a high logic level, and the output data signal DQ is driven to a high logic level with pre-emphasis, which is a pre-emphasis high logic voltage (i.e., a high pumped voltage) during pre-emphasis. At time T1 the timing control signal DDFu changes to a low logic level based on the rising edge of the pull-up data activation signal DATAu and the timing control signal DDFd changes to a high logic level based on the falling edge of the pull-down data activation signal DATAd. In comparison to the timing shown in FIG. 8, the timing control signal DDFu changes to a low logic level and the timing control signal DDFd changes to a high logic level sooner after the pull-up data activation signal DATAu and the pull-down data activation signal DATAd changes.

The low logic level timing control signal DDFu at time T1 causes the pre-emphasis control signal 1shotPu_Y to change to a low logic level. The earlier low logic level timing control signal DDFu and the resulting low logic level 1shotPu_Y causes the pre-emphasis to end relatively earlier at time T1. While the pre-emphasis is timely applied to transition the output data signal DQ relatively quickly to the pre-emphasis logic high voltage, the duration of pre-emphasis is relatively shorter. The shorter duration of the pre-emphasis may not be sufficient to provide desired beneficial results.

The transition of the output data signal DQ to a pre-emphasis logic low level at time T2 and the relatively shorter duration of the pre-emphasis may likewise occur from the earlier timing control signal DDFd at time T3, which is due to the shorter delay of the one inverter of the inverters 123A.

Figure 13:
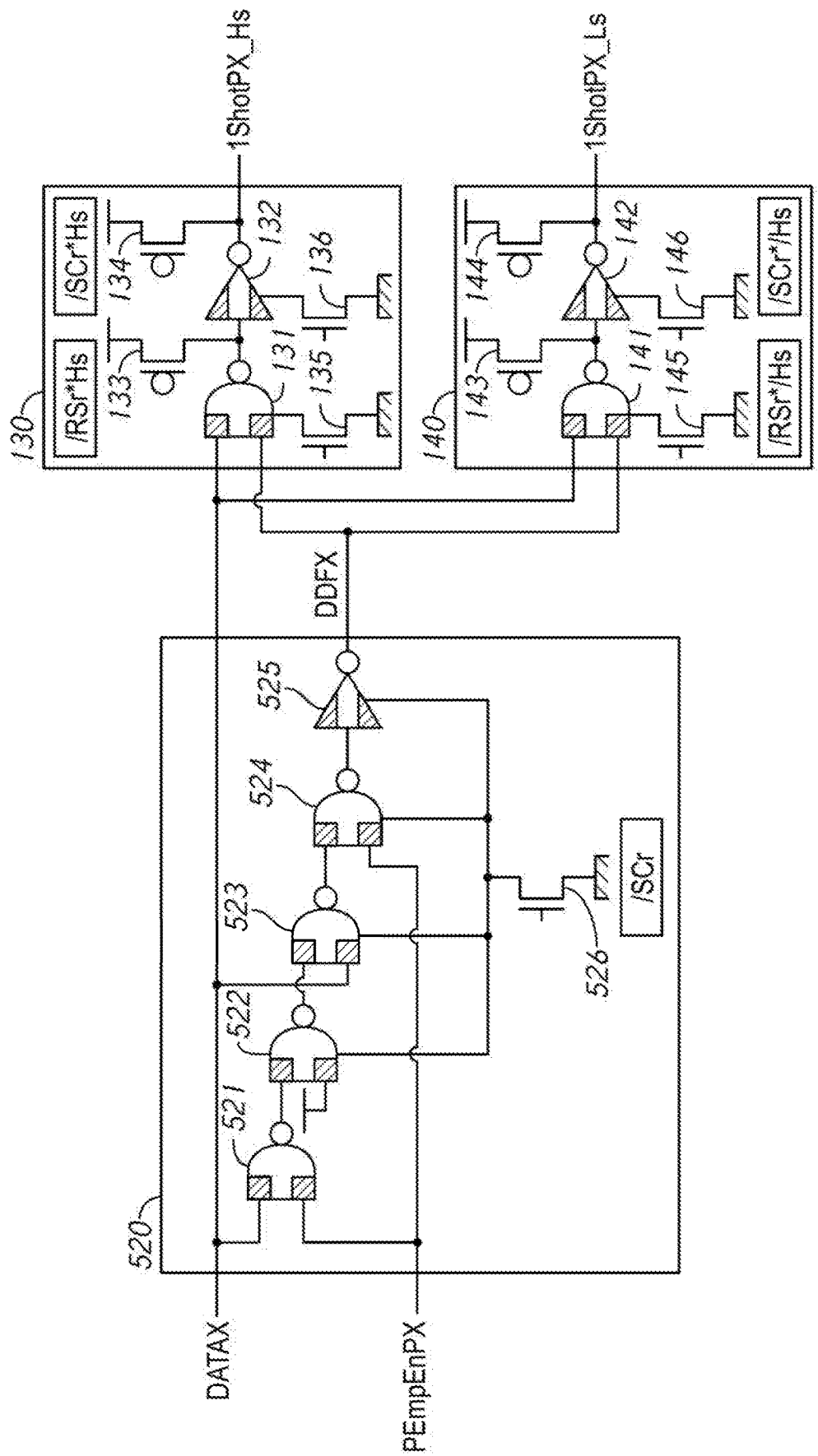
FIG. 13 is a block diagram of a pre-emphasis timing control circuit according to an embodiment of the disclosure, and logic circuits.

FIG. 13 is a block diagram of a pre-emphasis timing control circuit 520 according to an embodiment of the disclosure, and logic circuits 130 and 140. The pre-emphasis timing control circuit 520 may be used for controlling the timing of providing pre-emphasis by a pre-emphasis circuit. As previously described, the logic circuits 130 and 140 provide respective pre-emphasis control signals 1shotPX_Hs and 1shotPX_Ls having a timing as controlled by the pre-emphasis timing control circuit 520. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data. In some embodiments of the disclosure, the pre-emphasis timing control circuit 520 may be included in the pre-emphasis timing control circuit 220 and/or 420. The logic circuit 130 may be included in the logic circuits 230 and/or 430, and the logic circuit 140 may be included in the logic circuits 260 and/or 460. In some embodiments of the disclosure, the pre-emphasis timing control circuit 520 may be included in the pre-emphasis circuits 23 and/or 24.

The pre-emphasis timing control circuit 520 includes NAND gate circuits 521-524 and inverter circuit 525. The NAND gate circuit 521 receives data activation signal DATAX and a pre-emphasis enable signal PEmpEnPX and provides an output signal to a first input of the NAND gate circuit 522, which also receives a high logic level voltage at a second input. The NAND gate circuit 523 receives the data activation signal DATAX and an output signal of the NAND gate circuit 522, and provides an output signal to the NAND gate 524, which also receives the pre-emphasis enable signal PEmpEnPX. The NAND gate circuit 524 provides an output signal to the inverter 525, which provides the timing control signal DDFX. A transistor 526 that receives a reset signal /SCr resets the NAND gate circuits 522-524 and the inverter 525 when activated.

Figure 14:
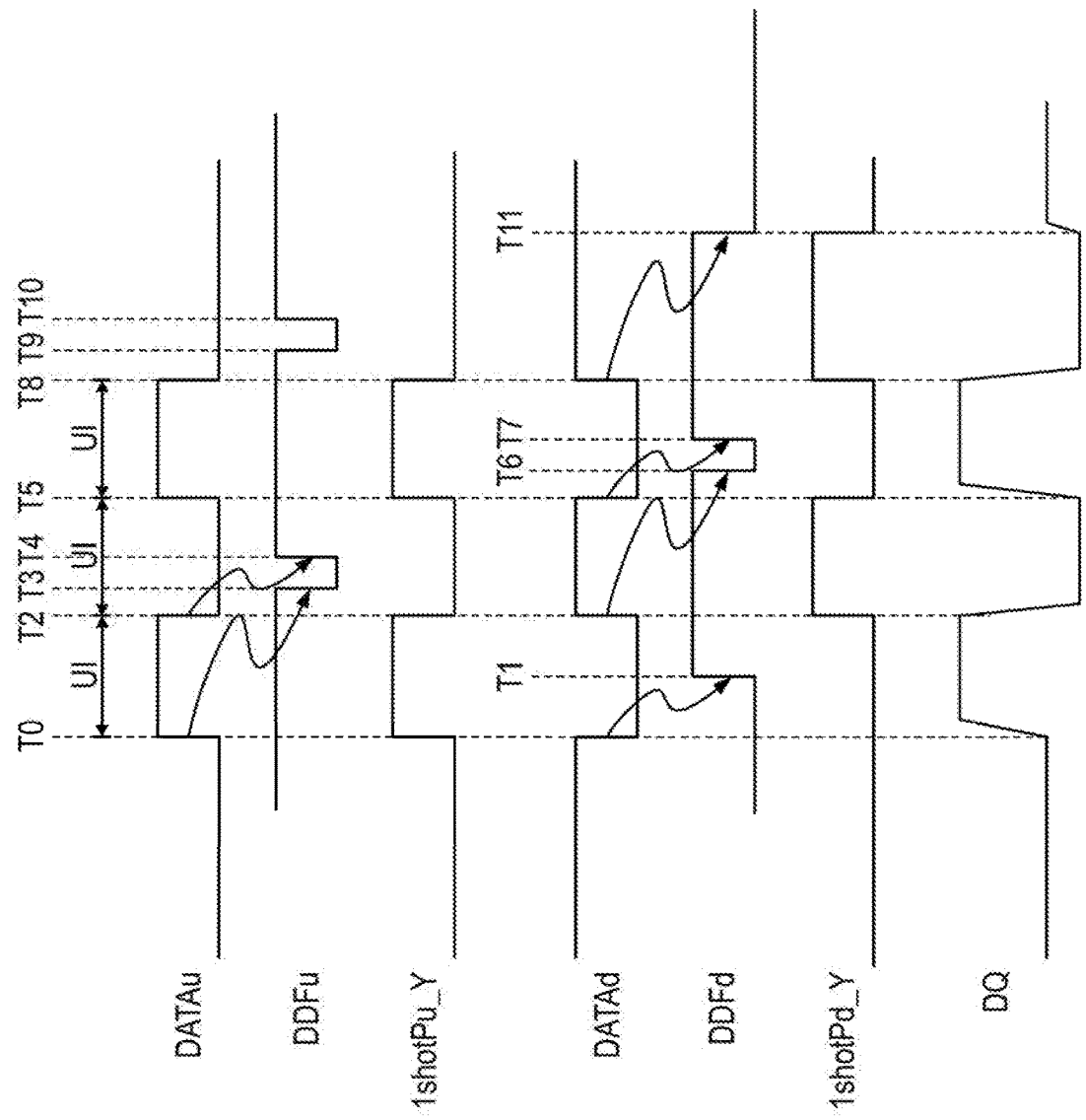
FIG. 14 is a timing diagram of various signals during operation of the pre-emphasis timing control circuit and the logic circuits of FIG. 13 according to an embodiment of the disclosure.

Operation of the pre-emphasis timing control circuit 520 and the logic circuits 130 and 140 will be described with reference to FIG. 14. FIG. 14 is a timing diagram of various signals during operation of the pre-emphasis timing control circuit 520 and the logic circuits 130 and 140 according to an embodiment of the disclosure. FIG. 14 illustrates pull-up and pull-down data activation signals DATAu and DATAd for three unit intervals (e.g., three bits of data, 1, 0, and 1), timing control signals DDFu and DDFd, and pre-emphasis control signals 1shotPu_Y and 1shotPd_Y (where Y is Hs for the high speed data path and Y is Ls for the low speed data path). In the example of FIG. 14, the control signal /SCr is a high logic level to provide power to the NAND gate circuits 521-524 and the inverter 525. Additionally, the control signals /RSr*Hs and /SCr*Hs are a high logic level to activate the logic circuit 130 for the high-speed speed path or the control signals /RSr*/Hs and /SCr*/Hs are a high logic level to activate the logic circuit 140 for the low-speed path.

The timing control signal DDFu may be provided by a first pre-emphasis timing control circuit 520 that receives the pull-up data activation signal DATAu and pre-emphasis enable signal PEmpEnPu (not shown), and the pre-emphasis control signal 1shotPu_Y is provided by logic circuit 130 and/or 140 that receives the timing control signal DDFu and the pull-up data activation signal DATAu. The timing control signal DDFd may be provided by a second pre-emphasis timing control circuit 520 that receives the pull-down data activation signal DATAd and pre-emphasis enable signal PEmpEnPd (not shown), and the pre-emphasis control signal 1shotPd_Y is provided by logic circuit 130 and/or 140 that receives the timing control signal DDFd and the pull-down data activation signal DATAd.

At time T0, the pull-up data activation signal DATAu changes to a high logic level. As a result, the pre-emphasis control signal 1shotPu_Y changes to a high logic level and the output data signal DQ changes to a high logic level with pre-emphasis. With the pre-emphasis control signal 1shotPu_Y at a high logic level, high logic level pre-emphasis is applied and the high logic level of the output data signal DQ is driven to a pre-emphasis high logic voltage (e.g., a pumped high voltage). Also at time T0, the pull-down data activation signal DATAd changes to a low logic level, which propagates through the NAND logic circuits 523 and 524, and the inverter circuit 525 of the second pre-emphasis timing control circuit 520 to provide a high logic level timing control signal DDFd at time T1.

At time T2, the pull-up data activation signal DATAu changes to a low logic level. As a result, the pre-emphasis control signal 1shotPu_Y changes to a low logic level, which causes the high logic level pre-emphasis to no longer be applied. Also at time T2, the pull-down data activation signal DATAd changes to a high logic level. As a result, the pre-emphasis control signal 1shotPd_Y changes to a high logic level and the output data signal DQ changes to a low logic level with pre-emphasis. With the pre-emphasis control signal 1shotPd_Y at a high logic level, low logic level pre-emphasis is applied and the low logic level of the output data signal DQ is driven to a pre-emphasis low logic voltage (e.g., a pumped low voltage).

At time T3, the timing control signal DDFu changes to a low logic level resulting from the rising edge of the pull-up data activation signal DATAu from time T0 having propagated through the NAND logic circuits 521-524 and the inverter circuit 525 of the first pre-emphasis timing control circuit 520. In effect, the rising transition of the pull-up data activation signal at time T0 is delayed to be provided at time T3 as a falling transition of the timing control signal DDFu.

The delay provided to the pull-up data activation signal by the pre-emphasis timing control circuit 520 is greater than one UI.

At time T4, the timing control signal DDFu changes to a high logic level resulting from the falling edge of the pull-up data activation signal DATAu from time T2 having propagated through the NAND logic circuits 523 and 524, and the inverter circuit 525 of the second pre-emphasis timing control circuit 520. In effect, the falling transition of the pull-up data activation signal at time T2 is delayed to be provided at time T4 as a rising transition of the timing control signal DDFu. The delay provided to the pull-up data activation signal by the pre-emphasis timing control circuit 520 is less than for a rising transition of the pull-up data activation signal DATAu (e.g., delay between times T0 and T3). As a result of the delays for the rising and falling transitions of the pull-up data activation signal DATAu, pre-emphasis may be provided longer than one UI if the data is the same over two or more UIs (e.g., DATAu remains the same for more than one UI), but the pre-emphasis is disabled at more than one UI if the data changes after one UI.

At time T5, the pull-up data activation signal DATAu changes to a high logic level. As a result, the pre-emphasis control signal 1shotPu_Y changes to a high logic level and the output data signal DQ changes to a high logic level with pre-emphasis. With the pre-emphasis control signal 1shotPu_Y at a high logic level, high logic level pre-emphasis is applied and the high logic level of the output data signal DQ is driven to a pre-emphasis high logic voltage (e.g., a high pumped voltage). Also at time T5, the pull-down data activation signal DATAd changes to a low logic level. As a result, the pre-emphasis control signal 1shotPd_Y changes to a low logic level, which causes the low logic level pre-emphasis to no longer be applied.

At time T6, the timing control signal DDFd changes to a low logic level resulting from the rising edge of the pull-down data activation signal DATAd from time T2 having propagated through the NAND logic circuits 521-524 and the inverter circuit 525 of the second pre-emphasis timing control circuit 520. In effect, the rising transition of the pull-down data activation signal at time T2 is delayed to be provided at time T6 as a falling transition of the timing control signal DDFd. The delay provided to the pull-up data activation signal by the pre-emphasis timing control circuit 520 is greater than one UI.

At time T7, the timing control signal DDFd changes to a high logic level resulting from the falling edge of the pull-up data activation signal DATAd from time T5 having propagated through the NAND logic circuits 523 and 524, and the inverter circuit 525 of the second pre-emphasis timing control circuit 520. In effect, the falling transition of the pull-down data activation signal at time T5 is delayed to be provided at time T7 as a rising transition of the timing control signal DDFd. The delay provided to the pull-down data activation signal by the pre-emphasis timing control circuit 520 is less than for a rising transition of the pull-down data activation signal DATAd (e.g., delay between times T2 and T6). As a result of the delays for the rising and falling transitions of the pull-down data activation signal DATAd, pre-emphasis may be provided longer than one UI if the data is the same over two or more UIs (e.g., DATAd remains the same for more than one UI), but the pre-emphasis is disabled at one UI if the data changes after one UI.

The logic level transitions at times T8-T10 of the pull-up data activation signal DATAu, timing control signal DDFu, the pre-emphasis control signal 1shotPu_Y, and output data signal DQ are similar to the logic level transitions of the same signals at times T2-T4, as previously described. Similarly, the logic level transitions of the pull-down data activation signal DATAd, timing control signal DDFd, and the pre-emphasis control signal 1shotPd_Y at times T8-T10 are similar to the logic level transitions of the same signals at times T2-T4.

Additionally, at time T11, the timing control signal DDFd changes to a low logic level resulting from the rising edge of the pull-down data activation signal DATAd from time T8 having propagated through the NAND logic circuits 521-524 and the inverter circuit 525 of the second pre-emphasis timing control circuit 520. The low logic level timing control signal DDFd causes the pre-emphasis control signal 1shotPd_Y to change to a low logic level, which causes the low logic level pre-emphasis to no longer be applied.

The pre-emphasis timing control circuit 520 provides a timing control signal DDFX having a timing relative to the data activation signal DATAX that avoids the late and short duration pre-emphasis issues previously described. For example, the timing control signal DDFX includes a first signal transition having a first delay relative to a transition of the data activation signal DATAX and further includes a second signal transition (opposite of the first signal transition) having a second delay relative to another transition of the data activation signal DATAX. The first delay is different than the second delay. In some embodiments, the first delay is greater than the second delay. For example, with reference to FIG. 14, the falling transition of the timing control signal DDFu at time T3 has a first delay relative to the rising transition of the pull-up data activation signal DATAu at time T0 and the rising transition of the timing control signal DDFu at time T4 has a second delay relative to the falling transition of the pull-up data activation signal DATAd at time T2. The first delay is relatively longer than the second delay. As a result, a rising edge of the data activation signal DATAX is delayed relatively long to provide a sufficient pulse width, while a falling edge is delayed relatively short to end before a next UI.

Additionally, when the delay for securing the pulse width is set longer than UI, the pre-emphasis timing control circuit 520 can perform pre-emphasis for longer than one UI if identical data continues for two or more UI (e.g., DATAX remains the same for more than one UI). However, if the data changes after one UI or changes to high impedance, the pre-emphasis is stopped at one UI. Thus, pre-emphasis may be provided for more than one UI when the data does not change for two or more UI, but may be provided for one UI if the data changes after one UI. For example, as shown in FIG. 14 from time T8 when the pull-down data activation signal DATAd changes to a high logic level (as does the pre-emphasis control signal 1shotPd_Y) and remains the same through at least time T11 when the timing control signal DDFd changes to a low logic level (as does the pre-emphasis control signal 1shotPd_Y), which is more than one UI after time T8. As a result, pre-emphasis is provided for more than one UI (e.g., from time T8 to time T11) when the data remains the same for more than one U.

Figure 15:
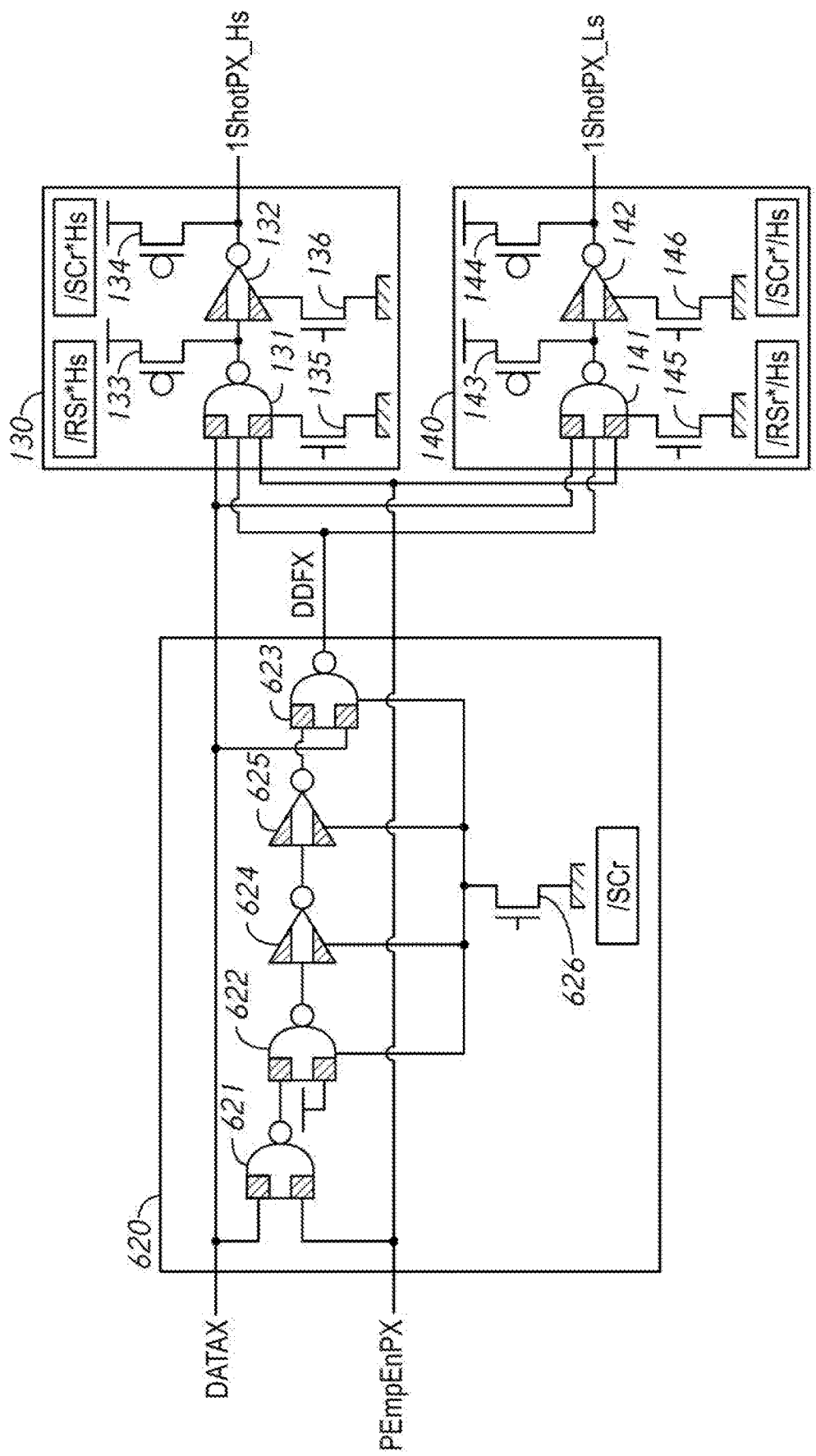
FIG. 15 is a block diagram of a pre-emphasis timing control circuit according to an embodiment of the disclosure, and logic circuits.

FIG. 15 is a block diagram of a pre-emphasis timing control circuit 620 according to an embodiment of the disclosure, and logic circuits 130 and 140. The pre-emphasis timing control circuit 620 may be used for controlling the timing of signal pre-emphasis by a pre-emphasis circuit. As previously described, the logic circuits 130 and 140 provide respective pre-emphasis control signals 1shotPX_Hs and 1shotPX_Ls having a timing as controlled by the pre-emphasis timing control circuit 620. The pre-emphasis control signal 1shotPX_Hs may be provided by the logic circuit 130 to a high-speed path for data and the pre-emphasis control signal 1shotPX_Ls may be provided by the logic circuit 140 to a low-speed path for data. In some embodiments of the disclosure, the pre-emphasis timing control circuit 620 may be included in the pre-emphasis timing control circuit 220 and/or 420. The logic circuit 130 may be included in the logic circuits 230 and/or 430, and the logic circuit 140 may be included in the logic circuits 260 and/or 460. In some embodiments of the disclosure, the pre-emphasis timing control circuit 520 may be included in the pre-emphasis circuits 23 and/or 24.

The pre-emphasis timing control circuit 620 includes NAND gate circuits 621-623 and inverter circuits 624 and 625. The NAND gate circuit 621 receives data activation signal DATAX and a pre-emphasis enable signal PEmpEnPX and provides an output signal to a first input of the NAND gate circuit 622, which also receives a high logic level voltage at a second input. The inverter circuit 624 receives an output signal of the NAND gate circuit 622, and provides an output signal to the inverter circuit 625. The NAND gate 623 receives the data activation signal DATAX and the output signal from the inverter circuit 625, and provides the timing control signal DDFX. A transistor 626 that receives a reset signal /SCr resets the NAND gate circuits 622 and 623 and the inverter circuits 624 and 625 when activated.

Figure 16:
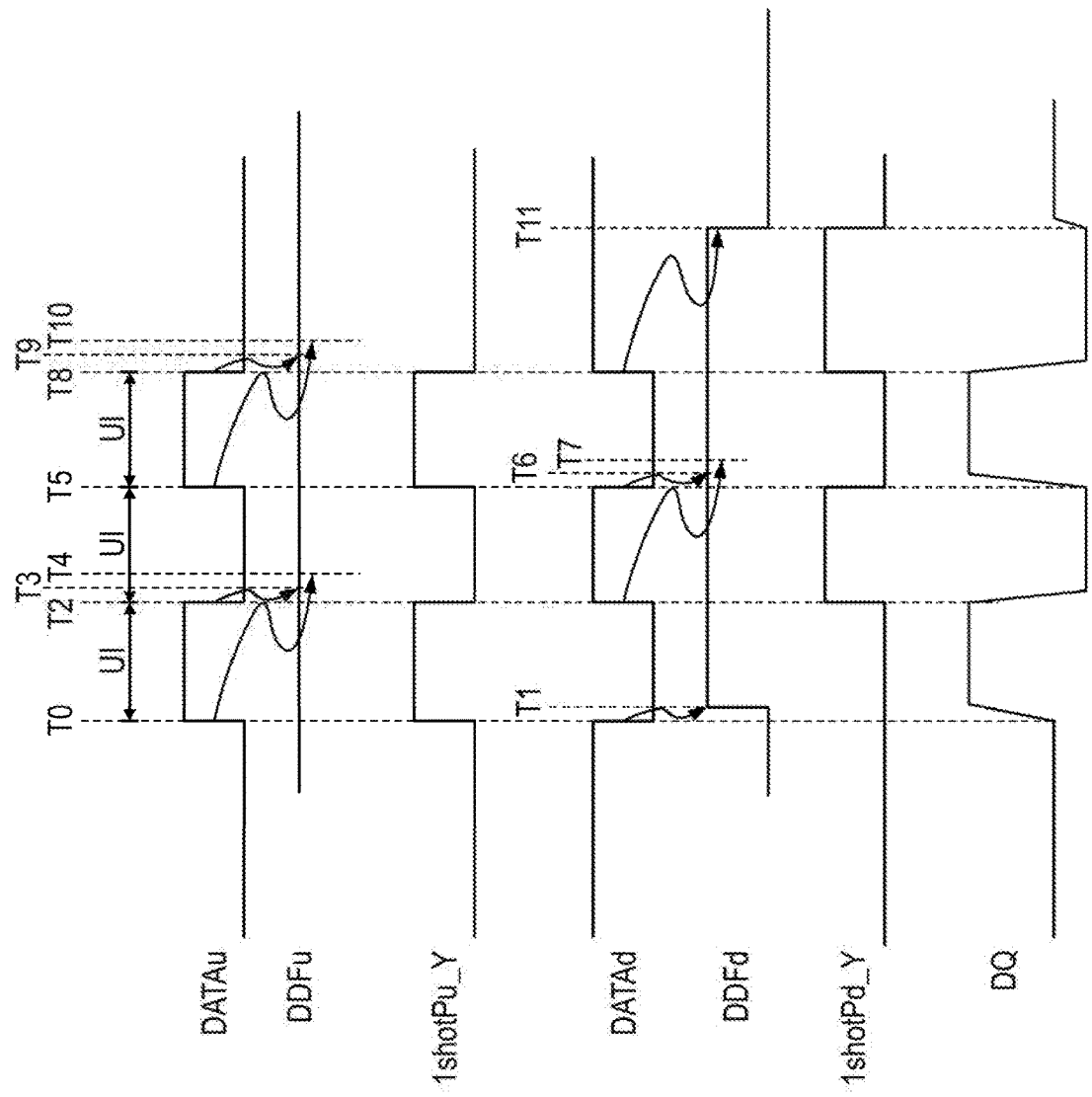
FIG. 16 is a timing diagram of various signals during operation of the pre-emphasis timing control circuit and the logic circuits of FIG. 16 according to an embodiment of the disclosure.

Operation of the pre-emphasis timing control circuit 620 and the logic circuits 130 and 140 will be described with reference to FIG. 16. FIG. 16 is a timing diagram of various signals during operation of the pre-emphasis timing control circuit 220 and the logic circuits 130 and 140 according to an embodiment of the disclosure. FIG. 16 illustrates pull-up and pull-down activation signals DATAu and DATAd for three unit intervals (e.g., three bits of data, 1, 0, and 1), timing control signals DDFu and DDFd, and pre-emphasis control signals 1shotPu_Y and 1shotPd_Y (where Y is Hs for the high speed data path and Y is Ls for the low speed data path). In the example of FIG. 16, the control signal /SCr is a high logic level to provide power to the NAND gate circuits 621-623 and the inverters 624 and 625. Additionally, the control signals /RSr*Hs and /SCr*Hs are a high logic level to activate the logic circuit 130 for the high-speed speed path or the control signals /RSr*/Hs and /SCr*/Hs are a high logic level to activate the logic circuit 140 for the low-speed path.

The timing control signal DDFu may be provided by a first pre-emphasis timing control circuit 620 that receives the pull-up activation signal DATAu and pre-emphasis enable signal PEmpEnPu (not shown), and the pre-emphasis control signal 1shotPu_Y is provided by logic circuit 130 and/or 140 that receives the pull-up activation signal DATAu, timing control signal DDFu, and the pre-emphasis enable signal PEmpEnPu. The timing control signal DDFd may be provided by a second pre-emphasis timing control circuit 620 that receives the pull-down activation signal DATAd and pre-emphasis enable signal PEmpEnPd (not shown), and the pre-emphasis control signal 1shotPd_Y is provided by logic circuit 130 and/or 140 that receives the timing control signal DDFd, timing control signal DDFd, and the pre-emphasis enable signal PEmpEnPd.

At time T0, the pull-up data activation signal DATAu changes to a high logic level. As a result, the pre-emphasis control signal 1shotPu_Y changes to a high logic level and the output data signal DQ is changes to a high logic level with pre-emphasis. With the pre-emphasis control signal 1shotPu_Y at a high logic level, high logic level pre-emphasis is applied and the high logic level of the output data signal DQ is driven to a pre-emphasis high logic voltage (e.g., a pumped high voltage). Also at time T0, the pull-down data activation signal DATAd changes to a low logic level, which propagates through the NAND logic circuit 623 to provide a high logic level timing control signal DDFd at time T1.

At time T2, the pull-up data activation signal DATAu changes to a low logic level. As a result, the pre-emphasis control signal 1shotPu_Y changes to a low logic level, which causes the high logic level pre-emphasis to no longer be applied. Also at time T2, the pull-down data activation signal DATAd changes to a high logic level. As a result, the pre-emphasis control signal 1shotPd_Y changes to a high logic level and the output data signal DQ is changes to a low logic level with pre-emphasis. With the pre-emphasis control signal 1shotPd_Y at a high logic level, low logic level pre-emphasis is applied and the low logic level of the output data signal DQ is driven to a pre-emphasis low logic voltage (e.g., a pumped low voltage).

At time T3, the timing control signal DDFu remains at a high logic level as the falling edge of the pull-up data activation signal DATAu from time T2 causes the NAND logic circuit 623 of the first pre-emphasis timing control circuit 620 to provide a high logic level timing control signal DDFu.

At time T4, the rising edge of the pull-up data activation signal DATAu from time T0 has propagated through the NAND logic circuits 621 and 622, and through the inverter circuits 624 and 625 to be provided as a high logic level to the NAND logic circuit 623. With the low logic level pull-up data activation signal DATAu from time 12 and the high logic level output from the inverter 625 (based on the rising edge of the pull-up data activation signal DATAu from time T0), the timing control signal DDFu remains at a high logic level at time T4. In effect, the rising transition of the pull-up data activation signal at time T0 is delayed by the pre-emphasis timing control circuit 520. The delay provided to the pull-up data activation signal is greater than one UI However, the delay for the falling edge of the pull-up data activation signal DATAu at time T2 is relatively short and causes the timing control signal DDFu to remain at a high logic level at time T3 since the delayed rising transition of the DATAu signal (from time T0) does not pass through until later (e.g., time T4). As a result of the delays for the rising and falling transitions of the pull-up data activation signal DATAu, pre-emphasis may be provided longer than one UI if the data is the same over two or more UIs (e.g., DATAu remains the same for more than one UI), but the pre-emphasis is disabled at more than one UI if the data changes after one UI.

At time T5, the pull-up data activation signal DATAu changes to a high logic level. As a result, the pre-emphasis control signal 1shotPu_Y changes to a high logic level and the output data signal DQ changes to a high logic level with pre-emphasis. With the pre-emphasis control signal 1shotPu_Y at a high logic level, high logic level pre-emphasis is applied and the high logic level of the output data signal DQ is driven to a pre-emphasis high logic voltage (e.g., a pumped high voltage). Also at time T5, the pull-down data activation signal DATAd changes to a low logic level. As a result, the pre-emphasis control signal 1shotPd_Y changes to a low logic level, which causes the low logic level pre-emphasis to no longer be applied.

At time T6, the timing control signal DDFd remains at a high logic level as the falling edge of the pull-down data activation signal DATAd from time T5 causes the NAND logic circuit 623 of the second pre-emphasis timing control circuit 620 to provide a high logic level timing control signal DDFd.

At time T7, the rising edge of the pull-down data activation signal DATAd from time T2 has propagated through the NAND logic circuits 621 and 622, and through the inverter circuits 624 and 625 of the second pre-emphasis timing control circuit 620 to be provided as a high logic level to the NAND logic circuit 623. With the low logic level pull-down data activation signal DATAd from time T5 and the high logic level output from the inverter 625 of the second pre-emphasis timing control circuit 620 (based on the rising edge of the pull-down data activation signal DATAd from time T2), the timing control signal DDFd remains at a high logic level at time T7. In effect, the rising transition of the pull-down data activation signal at time T2 is delayed by the pre-emphasis timing control circuit 520. The delay provided to the pull-down data activation signal is greater than one UI. However, the delay for the falling edge of the pull-down data activation signal DATAd at time T5 is relatively short and causes the timing control signal DDFd to remain at a high logic level at time T6 since the delayed rising transition of the DATAd signal (from time T0) does not pass through until later (e.g., time T7). As a result of the delays for the rising and falling transitions of the pull-down data activation signal DATAd, pre-emphasis may be provided longer than one UI if the data is the same over two or more UIs (e.g., DATAd remains the same for more than one UI), but the pre-emphasis is disabled at more than one UI if the data changes after one UI.

The logic level transitions at times T8-T10 of the pull-up data activation signal DATAu, timing control signal DDFu, the pre-emphasis control signal 1shotPu_Y, and output data signal DQ are similar to the logic level transitions of the same signals at times T2-T4, as previously described. Similarly, the logic level transitions of the pull-down data activation signal DATAd, timing control signal DDFd, and the pre-emphasis control signal 1shotPd_Y at times T8-T10 are similar to the logic level transitions of the same signals at times T2-T4.

Additionally, at time T11, the timing control signal DDFd changes to a low logic level resulting from the rising edge of the pull-down data activation signal DATAd from time T8 having propagated through the NAND logic circuits through the NAND logic circuits 621 and 622, and through the inverter circuits 624 and 625 of the second pre-emphasis timing control circuit 620 to be provided as a high logic level to the NAND logic circuit 623. With the high logic level pull-down data activation signal DATAd at time T11 and the high logic level output from the inverter 625 of the second pre-emphasis timing control circuit 620 (based on the rising edge of the pull-down data activation signal DATAd from time T8), the timing control signal DDFd changes to a low logic level at time T11.

The pre-emphasis timing control circuit 620 provides a timing control signal DDFX having a timing relative to the data activation signal DATAX that avoids the late and short duration pre-emphasis issues previously described. As with the pre-emphasis timing control circuit 520, the timing control signal DDFX includes a first signal transition at a first delay relative to a transition of the data activation signal DATAX and further includes a second signal transition (opposite of the first signal transition) at a second delay relative to another transition of the data activation signal DATAX. The first delay is different than the second delay. In some embodiments, the first delay is greater than the second delay.

In comparison to the pre-emphasis timing control circuit 520, the second delay of the pre-emphasis timing control circuit 620 is shorter. The first and second delays for the pre-emphasis timing control circuit 620 are such that the timing control signal DDFX does not transition between high and low logic levels when the first delay is greater than (1 UI+second delay). That is, since the first signal transition of the timing control signal DDFX (following a first delay) is delayed until a time after the second signal transition of the timing control signal DDFX, the second signal transition prevents the first signal transition from occurring.

As a result, the one shot signal DDFX does not transition and can continuously provide pre-emphasis as the data activation signal changes each UI, but stop providing pre-emphasis (after more than one UI) if the data does not change for two or more UI. For example, as shown in FIG. 16 from time T8 when the pull-down data activation signal DATAd changes to a high logic level (as does the pre-emphasis control signal 1shotPd_Y) and remains the same through at least time T Il when the timing control signal DDFd changes to a low logic level (as does the pre-emphasis control signal 1shotPd_Y), which is more than one UI after time T8. As a result, pre-emphasis is provided for more than one UI (e.g., from time T8 to time T1) when the data remains the same for more than one UI.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal; and
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal based on the pull-up data activation signal and further including a pull-up logic circuit configured to provide a pull-up pre-emphasis control signal based on the pull-up data activation signal and the timing control signal to control providing the pull-up pre-emphasis for greater than one unit interval of data when the pull-up data activation signal remains active for greater than one unit interval,
wherein the pull-up logic circuit is further configured to provide the pull-up pre-emphasis control signal to control providing the pull-up pre-emphasis for one unit interval of data when the pull-up data activation signal become inactive at one unit interval.

2. The apparatus of claim 1, further comprising a pull-down pre-emphasis circuit configured to receive the pull-down data activation signal and provide pull-down pre-emphasis responsive to the active pull-down data activation signal, the pull-down pre-emphasis circuit including a pull-down pre-emphasis timing control circuit configured to provide a pull-down timing control signal based on the pull-down data activation signal and further including a pull-down logic circuit configured to provide a pull-down pre-emphasis control signal to control providing the pull-down pre-emphasis for greater than one unit interval of data when the pull-down data activation signal remains active for greater than one unit interval.

3. The apparatus of claim 1 wherein the pull-up pre-emphasis control signal controls providing the pull-up pre-emphasis to less than two unit intervals.

4. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal; and
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal based on the pull-up data activation signal and further including a pull-up logic circuit configured to provide a pull-up pre-emphasis control signal based on the pull-up data activation signal and the timing control signal to control providing the pull-up pre-emphasis for greater than one unit interval of data when the pull-up data activation signal remains active for greater than one unit interval,
wherein the pre-emphasis timing control circuit comprises:
a first NAND gate circuit configured to receive the pull-up data activation signal and a pre-emphasis enable signal and to provide a first output signal;
a second NAND gate circuit configured to receive the first output signal and a logic high voltage and to provide a second output signal;
a third NAND gate circuit configured to receive the second output signal and the pull-up data activation signal and to provide a third output signal;
a fourth NAND gate circuit configured to receive the third output signal and the pre-emphasis enable signal and to provide a fourth output signal; and
an inverter configured to receive the fourth output signal and configured to provide the timing control signal.

5. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal; and
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal based on the pull-up data activation signal and further including a pull-up logic circuit configured to provide a pull-up pre-emphasis control signal based on the pull-up data activation signal and the timing control signal to control providing the pull-up pre-emphasis for greater than one unit interval of data when the pull-up data activation signal remains active for greater than one unit interval,
wherein the pre-emphasis timing control circuit comprises:
a first NAND gate circuit configured to receive the pull-up data activation signal and a pre-emphasis enable signal and to provide a first output signal;
a second NAND gate circuit configured to receive the first output signal and a logic high voltage and to provide a second output signal;
a first inverter configured to receive the second output signal and to provide a third output signal;
a second inverter configured to receive the second output signal and to provide a fourth output signal; and
a third NAND gate circuit configured to receive the fourth output signal and the pull-up data activation signal and to provide the timing control signal.

6. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal; and
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal based on the pull-up data activation signal and further including a pull-up logic circuit configured to provide a pull-up pre-emphasis control signal based on the pull-up data activation signal and the timing control signal to control providing the pull-up pre-emphasis for greater than one unit interval of data when the pull-up data activation signal remains active for greater than one unit interval,
wherein the pre-emphasis timing control circuit is configured to provide a timing control signal having a first signal transition having a first delay relative to a rising transition of the pull-up data activation signal and further configured to provide the timing control signal having a second signal transition having a second delay relative to a falling transition of the pull-up data activation signal, wherein the first and second signal transitions are opposite and the second delay is different than the first delay.

7. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal; and
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal based on the pull-up data activation signal and further including a pull-up logic circuit configured to provide a pull-up pre-emphasis control signal based on the pull-up data activation signal and the timing control signal to control providing the pull-up pre-emphasis for greater than one unit interval of data when the pull-up data activation signal remains active for greater than one unit interval, wherein the pull-up circuit comprises a high-speed path and a low-speed path, and wherein the pull-up pre-emphasis circuit comprises a high-speed path and a low-speed path.

8. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal; and
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal based on the pull-up data activation signal and further including a pull-up logic circuit configured to provide a pull-up pre-emphasis control signal based on the pull-up data activation signal and the timing control signal to control providing the pull-up pre-emphasis for greater than one unit interval of data when the pull-up data activation signal remains active for greater than one unit interval, wherein the pull-up pre-emphasis control signal controls providing the pull-up pre-emphasis to less than two unit intervals, and wherein the pull-up pre-emphasis circuit further includes a second pull-up logic circuit configured to receive the timing control signal, wherein the pull-up logic circuit is configured to provide the pull-up pre-emphasis control signal for the high-speed path and the second pull-up logic circuit is configured to provide the pull-up pre-emphasis control signal for the low-speed path.

9. An apparatus, comprising:
a pull-up circuit configured to receive a pull-up data activation signal and drive a data terminal to a pull-up voltage responsive to an active pull-up data activation signal;
a pull-down circuit configured to receive a pull-down activation signal and drive a data terminal to a pull-down voltage responsive to an active pull-down data activation signal;
a pull-up pre-emphasis circuit configured to receive the pull-up data activation signal and provide pull-up pre-emphasis responsive to the active pull-up data activation signal, the pull-up pre-emphasis circuit including a pre-emphasis timing control circuit configured to provide a timing control signal having a first signal transition having a first delay relative to a rising transition of the pull-up data activation signal and further configured to provide the timing control signal having a second signal transition having a second delay relative to a falling transition of the pull-up data activation signal, wherein the first and second signal transitions are opposite and the second delay is different than the first delay.

10. The apparatus of claim 9 wherein the second delay is less than the first delay.

11. The apparatus of claim 9 wherein the first delay is greater than a time from a rising transition of the pull-up data activation signal to a falling transition of the pull-up data activation signal plus the second delay.

12. The apparatus of claim 9 wherein the first and second delays provide the second signal transition of the timing control signal before the first signal transition of the timing control signal.

13. The apparatus of claim 9 wherein the first delay is greater than one unit interval.

14. A method, comprising:
providing pull-up pre-emphasis responsive to an active pull-up activation signal;
ceasing pull-up pre-emphasis responsive to an inactive pull-up activation signal;
responsive to the pull-up activation signal remaining active for more than one unit interval, continuing to provide pull-up pre-emphasis for more than one unit interval and less than two unit intervals,
wherein providing the pull-up pre-emphasis comprises delaying a rising transition of the pull-up activation signal by a first delay to provide a first signal transition of a timing control signal and delaying a falling transition of the pull-up activation signal a second delay to provide a second signal transition of the timing control signal, wherein the second delay is less than the first delay.

15. The method of claim 14 wherein the pre-emphasis is provided for more than one unit interval until the first signal transition of the timing control signal.

16. The method of claim 14 wherein the first delay is greater than one unit interval.

17. The method of claim 14 wherein the first signal transition of the timing control signal comprises a falling transition of the timing control signal and the second signal transition of the timing control signal comprises a rising transition of the timing control signal.

18. The method of claim 14, further comprising:
providing pull-down pre-emphasis responsive to an active pull-down activation signal;
ceasing pull-down pre-emphasis responsive to and inactive pull-down activation signal;
responsive to the pull-down activation signal remaining active for more than one unit interval, continuing to provide pull-down pre-emphasis for more than one unit interval and less than two unit intervals.

* * * * *